United States Patent [19]
Tanishima

[11] Patent Number: 6,058,152
[45] Date of Patent: May 2, 2000

[54] PHASE COMPARISON METHOD AND APPARATUS FOR DIGITAL SIGNALS

[75] Inventor: Hideaki Tanishima, Kasugai, Japan

[73] Assignee: Fujitsu Limited, Kawasaki, Japan

[21] Appl. No.: 08/948,944

[22] Filed: Oct. 10, 1997

[30] Foreign Application Priority Data

Mar. 28, 1997 [JP] Japan .................................. 9-077666

[51] Int. Cl.[7] .................................................. H03D 3/24
[52] U.S. Cl. .................................. 375/376; 327/1; 327/2; 327/3
[58] Field of Search .................................. 375/376, 375; 327/1, 2, 3

[56] References Cited

U.S. PATENT DOCUMENTS

| | | |
|---|---|---|
| 4,122,405 | 10/1978 | Tietz et al. .................................. 331/1 |
| 4,264,866 | 4/1981 | Benes .................................. 328/134 |
| 5,142,555 | 8/1992 | Whiteside .................................. 375/81 |
| 5,438,285 | 8/1995 | Debaty .................................. 327/3 |
| 5,592,109 | 1/1997 | Notani et al. .................................. 327/3 |
| 5,736,872 | 4/1998 | Sharma et al. .................................. 327/3 |
| 5,744,983 | 4/1998 | Bazes .................................. 327/3 |
| 5,789,947 | 8/1998 | Sato .................................. 327/3 |

Primary Examiner—Stephen Chin
Assistant Examiner—Mohammad Ghayour
Attorney, Agent, or Firm—Staas & Halsey, LLP

[57] ABSTRACT

A phase comparator apparatus compares a first input signal and a second input signal to output first or second compare output signal. The apparatus includes a detector circuit and a compare output generator circuit. The detector circuit detects the phase difference between the first and second signals to output a detection signal. The compare output generator circuit determines the phase deviation between the first and second input signals using the detection signal and the second input signal. The compare output generator circuit outputs the first compare output signal when the second input signal lags behind the first input signal and outputs the second compare output signal when the second input signal leads the first input signal.

35 Claims, 20 Drawing Sheets

PHASE COMPARISON METHOD AND APPARATUS FOR DIGITAL SIGNALS

BACKGROUND OF THE INVENTION

1. Field of the Invention

The present invention relates to a phase comparison method and apparatus for digital signals, and to a phase comparator suitable for a PLL circuit. The PLL circuit is preferably incorporated in a data demodulator of a data reading apparatus.

2. Description of the Related Art

Recently, optical disks have been receiving a great deal of attention and have been developed as large-capacity recording media, such as LDs, CD-ROMs, MDs and PDs, to store a vast and ever-increasing amount of data, which is handled by multi-media systems. At present, DVDs (Digital Video Disks), which have the same size as a CD-ROM but have a capacity of approximately 7.5 times that of the CD-ROM, are being developed. There is a growing demand for a data reading apparatus that can accomplish fast reproduction of a huge amount of data recorded on such a recording medium.

A conventional data reading apparatus generally reads data, recorded on a recording medium like a CD-ROM, in accordance with the CLV (Constant Linear Velocity) system. This CLV system changes the rotational speed of the recording medium in accordance with the reading position on the recording medium by a pickup device in such a way that the linear velocity at each reading position of the pickup device is constant.

A recording medium according to this CLV system has sectors formed on individual tracks. The sectors have a constant length regardless of whether they are located at the radially inner portion or the radially outer portion of the recording medium. The amount of data read per unit time by the pickup device is designed to be constant irrespective of whether the inner portion or the outer portion of the recording medium is being read from. Further, the lengths of recording pits in each sector are designed to be constant irrespective of whether they are located at the inner portion or the outer portion of the recording medium.

In this CLV system, the data reproduction speed becomes faster by increasing the number of rotations of the recording medium. The CLV system however requires that the number of rotations per unit time of the recording medium when reading from the radially inner portion be different from that when reading from the radially outer portion. This is because the angle of sectors at the inner portion differs from the angle of sectors at the outer portion so that the sector lengths on a recording medium are constant irrespective of their location on the recording medium. Changing the number of rotations per unit time in such a way requires a large-torque and large-size motor capable of quickly adjusting the speed. The use of such a motor results in an increase in size and power consumption of a disk apparatus.

In view of the above, a CAV (Constant Angular Velocity) system has been designed to reduce the size and power consumption of a motor while maintaining the fast data reproduction. This CAV system reads data recorded on a recording medium while turning the recording medium in such a manner that the number of rotations per unit time of the motor, or the angular velocity, is constant. A recording medium according to this CAV system has sectors formed on individual tracks whose lengths become longer toward the radially outer portion of the recording medium. That is, the lengths of recording pits to be recorded on the recording medium become longer toward the outer portion of the recording medium. This design differs from that of the CLV system.

Efforts have been made to read data recorded on a recording medium according to the CLV system using a disk apparatus according to the CAV system. In this case, since the linear velocity at the radially outer portion differs from the linear velocity at the radially inner portion, the pickup device outputs an analog read signal having a frequency F that becomes higher toward the outer portion of the recording medium as compared to that output when reading from the inner portion (i.e., F changes in accordance with the position of the pickup device), as shown in FIG. 1. In other words, a recording medium according to the CLV system has a constant sector length and a constant recording pit length at any position. Therefore, the linear velocity becomes faster toward the outer portion. So is the reading speed. For example, the frequency at the outer portion is 2.5 times the frequency at the inner portion.

The analog read signal from the pickup device is supplied via an amplifier to a signal processor. The signal processor performs digital conversion on the analog read signal in accordance with a reproduction clock, the period of which is synchronous with the frequency F of the analog read signal. This reproduction clock is generally generated by a PLL circuit. It is thus necessary to use a PLL circuit capable of generating a reproduction clock associated with a change in the frequency F of this analog read signal.

FIG. 3 shows a conventional digital type phase comparator incorporated in a PLL circuit. The phase comparator 60 has an RIN input terminal for receiving a constant frequency signal with a duty cycle of 50% as a reference signal RIN via a frequency divider 61 from a crystal oscillation module 62 and an FIN input terminal for receiving the output signal of an unillustrated VCO (Voltage Controlled Oscillator) as a feedback signal FIN via a frequency divider 63. The phase comparator 60 compares the phases of both input signals RIN and FIN with each other and supplies the comparison result as an up-signal UP or a down-signal DN to a charge pump (not shown).

FIG. 4 shows a block circuit of the digital type phase comparator 60. This phase comparator 60 includes a first NAND gate 60a, a first flip-flop 64 including second and third NAND gates 60b and 60c, a second flip-flop 65 including fourth and fifth NAND gates 60d and 60e, and sixth to ninth NAND gates 60f to 60i.

The first NAND gate 60a has a first input terminal for receiving the reference signal RIN from the crystal oscillation module 62 and a second input terminal for receiving the output signal of the eighth NAND gate 60h. The sixth NAND gate 60f has a first input terminal for receiving the feedback signal FIN from the VCO and a second input terminal for receiving the output signal of the ninth NAND gate 60i. The eighth NAND gate 60h receives the output signals of the first NAND gate 60a, the first flip-flop 64 and the seventh NAND gate 60g and outputs an up-signal UP indicating that the phase of the feedback signal FIN lags behind the phase of the reference signal RIN. The ninth NAND gate 60i receives the output signals of the sixth NAND gate 60f, the second flip-flop 65 and the seventh NAND gate 60g and outputs a down-signal DN indicating that the phase of the feedback signal FIN leads the phase of the reference signal RIN.

When the falling of the reference signal RIN is behind the falling of the feedback signal FIN as shown in FIG. 5A, the eighth NAND gate 60h of the phase comparator 60 outputs an up-signal UP having a low potential (L level) while the phase difference continues. At this time, the ninth NAND gate 60i of the phase comparator 60 outputs a down-signal DN having a high potential (H level).

When the falling of the reference signal RIN leads the falling of the feedback signal FIN as shown in FIG. 5B, the ninth NAND gate 60i of the phase comparator 60 outputs a down-signal DN having an L level during a period where the phase difference exists. At this time, the eighth NAND gate 60h of the phase comparator 60 outputs an H-level up-signal UP. When both signals RIN and FIN are in phase, the phase comparator 60 outputs both H-level up-signal UP and down-signal DN. This supply of H-level up-signal UP and down-signal DN stabilizes the operations of the charge pump and the VCO.

As shown in FIGS. 5A and 5B, the phase comparator 60 detects the falling from the H level to the L level of each of the reference signal RIN and the feedback signal FIN and outputs an L-level up-signal UP or down-signal DN indicating the time difference between both falling times. In other words, the phase comparator 60 does not output the up-signal UP or down-signal DN upon detection of the L-level to H-level rising of the reference signal RIN and the feedback signal FIN. The phase comparator 60 with this structure does not require the reference signal RIN, the duty cycle of which is 50%.

When data recorded on a recording medium according to the CLV system is read in accordance with the CAV system, however, the PLL circuit is not locked, which is a disadvantage.

The signal processor digitizes the analog read signal, which has been read from a CD-ROM and has passed an amplifier, to produce an EFM (Eight Fourteen Modulation) signal. The phase comparator 60 receives the EFM signal as the reference signal RIN from the RIN input terminal and receives the output signal of the VCO as the feedback signal FIN from the FIN input terminal. As shown in FIG. 2, this EFM signal has an irregular period, which varies within a range from a period of 3T to a period of 11T. The EFM signal is significant as to whether the high-potential (H level) period and the low-potential (L level) period are long or short, and there are nine kinds from the shortest period of 3T to the longest period of 11T. Therefore, the frequency of the EFM signal, which consists of the nine different periods, is not stable. Also, the frequency F of the analog read signal varies in accordance with the position of the pickup device (optical head). When the EFM signal, the frequency of which constantly varies, is used as the reference signal RIN, therefore, the PLL circuit is not locked. The reason for this is that while the phase comparator 60 can compare the phase of the feedback signal FIN with that of the reference signal RIN at the falling of the reference signal RIN, it cannot compare the phase of the feedback signal FIN with that of the reference signal RIN at the rising of the reference signal RIN.

FIG. 6 is an electric block circuit showing another conventional phase comparator. This phase comparator can allow a PLL circuit to be locked while using an EFM signal with a variable frequency as the reference signal RIN.

The phase comparator 70 includes first to fourth D flip-flops (DFs) 71 to 74, an exclusive-OR (EX-OR) gate 75 and a not exclusive-OR (NEX-OR) gate 76. The first to third DFs 71–73 are connected in series, and the first DF 71 at the first stage has a data input terminal D for receiving the reference signal RIN. The EX-OR gate 75 receives the reference signal RIN. The fourth DF 74 has a clock input terminal CK for receiving the feedback signal FIN, a first output terminal for outputting a clock CLK, which is the feedback signal FIN frequency-divided by 2, and a second output terminal for outputting an inverted clock XCLK, which is the clock CLK inverted. The second DF 72 has a clock input terminal CK for receiving the clock CLK. The first and third DFs 71 and 73 have clock input terminals CK for receiving the inverted clock XCLK.

The first DF 71 supplies the current status of the reference signal RIN to the data input terminal D of the second DF 72 in response to the rising of the inverted clock XCLK. In response to the rising of the clock CLK, the second DF 72 supplies the current status of the output terminal Q of the first DF 71 to the data input terminal D of the third DF 73 and the NEX-OR gate 76 from the output terminal Q. In response to the rising of the inverted clock XCLK, the third DF 73 supplies the current status of the output terminal Q of the second DF 72 to the NEX-OR gate 76 from the output terminal Q. The NEX-OR gate 76 receives output signals from the output terminals Q of the second and third DFs 72 and 73 and outputs a down-signal DN to a charge pump (not shown). The EX-OR gate 75 receives the reference signal RIN and an output signal from the inverted output terminal /Q of the first DF 71 and outputs an up-signal UP.

The operation of the phase comparator 70 will now be discussed in accordance with the timing charts in FIGS. 7 to 10.

Case 1. Where the rising of the clock CLK is in phase with the rising of the reference signal RIN:

As shown in FIG. 7, the up-signal UP falls to the L level when the reference signal RIN rises, and UP rises to the H level immediately after one period of the feedback signal FIN (half the period of the clock CLK) passes. The down-signal DN falls to the L level when the clock CLK next rises following the rising of the clock CLK at the rising of the reference signal RIN. The down-signal DN then rises to the H level immediately after one period of the feedback signal FIN passes. Thus, the up-signal UP and the down-signal DN hold the L level for the same length of time, (half the period of the clock CLK) in case 1.

Case 2. Where the rising of the clock CLK is in phase with the falling of the reference signal RIN:

As shown in FIG. 7, the up-signal UP falls to the L level when the reference signal RIN falls, and UP rises to the H level immediately after one period of the feedback signal FIN passes. The down-signal DN falls to the L level when the clock CLK next rises following the falling of the clock CLK together with the reference signal RIN. The down-signal then rises to the H level immediately after one period of the feedback signal FIN passes. Thus, the up-signal UP and the down-signal DN hold the L level for the same length of time (half the period of the clock CLK) in case 2.

Case 3. Where the rising of the clock CLK leads the rising of the reference signal RIN by half the period of the feedback signal FIN:

As shown in FIG. 8, the up-signal UP falls to the L level when the reference signal RIN rises, and UP rises to the H level when the clock CLK falls thereafter (immediately after half the period of the feedback signal FIN passes in this case). The down-signal DN falls to the L level when the clock CLK next rises after the rising of the reference signal RIN. The down-signal then rises to the H level when this clock CLK falls (immediately after one period of the feedback signal FIN passes in this case). Thus, the L-level up-signal UP is output for a quarter period of the clock CLK, and the down-signal DN is output for half the period of the clock CLK, in case 3.

Case 4. Where the rising of the clock CLK leads the falling of the reference signal RIN by half the period of the feedback signal FIN:

As shown in FIG. 8, the up-signal UP falls to the L level when the reference signal RIN falls, and UP rises to the H level when the clock CLK falls thereafter (immediately after half the period of the feedback signal FIN passes in this case). The down-signal DN falls to the L level when the clock CLK next rises after the falling of the reference signal RIN. The down-signal then rises to the H level when this clock CLK falls (immediately after one period of the feedback signal FIN passes in this case). Thus, the L-level up-signal UP is output for a quarter period of the clock CLK, and the L-level down-signal DN is output for half the period of the clock CLK, in case 4.

Case 5. Where the rising of the clock CLK lags behind the rising of the reference signal RIN by one period of the feedback signal FIN:

As shown in FIG. 9, the up-signal UP falls to the L level when the reference signal RIN rises, and UP rises to the H level when the clock CLK next falls thereafter (immediately after two periods of the feedback signal FIN pass in this case). The down-signal DN falls to the L level when the second clock CLK rises after the rising of the reference signal RIN. The down-signal then rises to the H level when that second clock CLK falls (immediately after one period of the feedback signal FIN passes in this case). Thus, the L-level up-signal UP is output for one period of the clock CLK, and the L-level down-signal DN is output for half the period of the clock CLK, in case 5.

Case 6. Where the rising of the clock CLK lags behind the falling of the reference signal RIN by one period of the feedback signal FIN:

As shown in FIG. 9, the up-signal UP falls to the L level when the reference signal RIN falls, and UP rises to the H level when the clock CLK next falls thereafter (immediately after two periods of the feedback signal FIN pass in this case). The down-signal DN falls to the L level when the second clock CLK rises after the falling of the reference signal RIN. The down-signal then rises to the H level when that second clock CLK falls (immediately after one period of the feedback signal FIN passes in this case). Thus, the L-level up-signal UP is output for one period of the clock CLK, and the L-level down-signal DN is output for half the period of the clock CLK, in case 6.

Case 7. Where the rising of the clock CLK lags behind the rising of the reference signal RIN by half the period of the feedback signal FIN:

As shown in FIG. 10, the up-signal UP falls to the L level when the reference signal RIN rises, and UP rises to the H level when the clock CLK next falls (immediately after one and half periods of the feedback signal FIN pass in this case). The down-signal DN falls to the L level when the clock CLK rises for the second time after the rising of the reference signal RIN. The down-signal then rises to the H level when that second clock CLK falls (immediately after one period of the feedback signal FIN passes in this case). Thus, the L-level up-signal UP is output for three fourths of the period of the clock CLK, and the L-level down-signal DN is output for half the period of the clock CLK, in case 7.

Case 8. Where the rising of the clock CLK lags behind the falling of the reference signal RIN by half the period of the feedback signal FIN:

As shown in FIG. 10, the up-signal UP falls to the L level when the reference signal RIN falls, and UP rises to the H level when the clock CLK next falls (immediately after one and one half periods of the feedback signal FIN pass in this case). The down-signal DN falls to the L level when the clock CLK rises for the second time after the falling of the reference signal RIN. The down-signal then rises to the H level when that second clock CLK falls (immediately after one period of the feedback signal FIN passes in this case). Thus, the L-level up-signal UP is output for three fourths of the period of the clock CLK, and the L-level down-signal DN is output for half the period of the clock CLK, in case 8.

As shown in FIGS. 7 to 10, the phase comparator 70 generates the L-level up-signal UP and down-signal DN for predetermined times in accordance with the phase difference between the reference signal RIN and the clock CLK, which originates from the feedback signal FIN. The up-signal UP and down-signal DN are output at some interval so that they do not overlap each other.

When the reference signal RIN is in phase with the clock CLK as shown in FIG. 7, the first H level of the reference signal RIN (EFM signal) is held for a period of 3T (T representing one period of the clock CLK), the subsequent L level is held for a period of 4T, the next H level is held for a period of 5T, and the subsequent L level is held for a period of 3T.

In any case, however, the phase comparator 70 with the above-described structure outputs th e up-signal UP and down-signal DN. When the reference signal RIN is in phase with the clock CLK, therefore, the charge pump and VCO receive the up-signal UP and down-signal DN and operate accordingly. Such operations generally release the frequency locking of the PLL circuit, making it difficult to hold the PLL circuit at a stable locked state.

SUMMARY OF THE INVENTION

Broadly speaking, the present invention relates to a phase comparator suitable for comparing the phases of a first digital signal, which has variable frequencies, and a second digital signal and holds the stable locked state of a PLL circuit when the phases of both signals coincide with each other. The present invention can be implemented in numerous ways including as an apparatus and a method.

In one aspect of the invention, a phase comparator apparatus compares a first input signal and a second input signal to output first or second compare output signal. The first compare output signal indicates that the second input signal lags behind the first input signal. The second compare output signal indicates that the second input signal leads the first input signal. The apparatus includes: a detector circuit for detecting the phase difference between the first and second signals to output a detection signal; and a compare output generator circuit, coupled to the detector circuit, for determining the phase deviation between the first and second input signals using the detection signal and the second input signal, wherein the compare output generator circuit outputs the first compare output signal when the second input signal lags behind the first input signal and outputs the second compare output signal when the second input signal leads the first input signal.

In a second aspect of the invention, a phase comparator apparatus compares a first digital signal and a second digital signal to output first or second compare output signal. The first compare output signal indicates that the second input signal lags behind the first input signal. The second compare output signal indicates that the second input signal leads the first input signal. The apparatus receives a third digital signal having a frequency that is higher than that of the second digital signal. The apparatus includes: a synchronization signal generator circuit for receiving the first and second digital signals and for generating a synchronization signal that is the first digital signal synchronizing with the second digital signal when the rising or falling edge of the first digital signal is detected; a phase difference detector circuit, coupled to the synchronization signal generator, for receiving the first digital signal and the synchronization signal and for detecting the phase difference between the first digital signal and the synchronization signal to output a detection signal; a first compare output generator circuit, coupled to the phase difference detector circuit, for receiving the second digital signal and the detection signal and for judging whether or not the second digital signal lags behind the first digital signal using the second digital signal and the detection signal to output the first compare output signal when the second input signal lags behind the first input signal; and a second compare output generator circuit, coupled to the detector circuit, for receiving the third digital signal and the detection signal and for judging whether or not the second digital signal leads the first digital signal using the third digital signal and the detection signal to output the second compare output signal when the second input signal leads the first input signal.

In a third aspect of the invention, a phase comparator apparatus compares a first digital signal and a second digital signal to output first or second compare output signal. The first compare output signal indicates that the second input signal lags behind the first input signal. The second compare output signal indicates that the second input signal leads the first input signal. The apparatus receives a third digital signal having a frequency that is higher than that of the second digital signal. The apparatus includes: a synchronization signal generator circuit for receiving the first and second digital signals and for generating a first synchronization signal that is the first digital signal synchronizing with the second digital signal when the rising or falling edge of the first digital signal is detected, wherein the synchronization signal generator generates a second synchronization signal lagging behind the first synchronization signal and generates a third synchronization signal lagging behind the second synchronization signal; a phase difference detector circuit, coupled to the synchronization signal generator, for receiving the first digital signal and the first synchronization signal and for detecting the phase difference between the first digital signal and the first synchronization signal to output a first detection signal, wherein the phase difference detector further outputs a second detection signal indicative of the phase difference between the second and third synchronization signals; a compare output generator circuit, coupled to the phase difference detector circuit, for receiving the second and third digital signals and the first detection signal and for determining the phase deviation between the first and second digital signals using the second and third digital signals and the first detection signal, wherein the compare output generator circuit outputs the first compare output signal when the second digital signal lags behind the first digital signal and outputs the second compare output signal when the second digital signal leads the first digital signal, wherein the second compare output signal corresponds to the second detection signal.

In a fourth aspect of the invention, there is provided a method for comparing a first input signal and a second input signal to generate first or second compare output signal, the first compare output signal indicating that the second input signal lags behind the first input signal, the second compare output signal indicating that the second input signal leads the first input signal. The method includes the steps of: detecting the phase difference between the first and second signals to generate a detection signal; determining the phase deviation between the first and second input signals using the detection signal and the second input signal; generating the first compare output signal when the second input signal lags behind the first input signal; and generating the second compare output signal when the second input signal leads the first input signal.

In a fifth aspect of the invention, there is provided a method for comparing a first digital signal and a second digital signal to generate first or second compare output signal, the first compare output signal indicating that the second input signal lags behind the first input signal, the second compare output signal indicating that the second input signal leads the first input signal, the second signal being originated from a third digital signal having a frequency that is higher than that of the second digital signal. The method includes the steps of: detecting the rising or falling edge of the first digital signal; generating a synchronization signal that is the first digital signal synchronizing with the second digital signal when the rising or falling edge of the first digital signal is detected; detecting the phase difference between the first digital signal and the synchronization signal to generate a detection signal; judging whether or not the second digital signal lags behind the first digital signal using the second digital signal and the detection signal; generating the first compare output signal when the second input signal lags behind the first input signal; judging whether or not the second digital signal leads the first digital signal using the third digital signal and the detection signal; and generating the second compare output signal when the second input signal leads the first input signal.

In a sixth aspect of the invention, there is provided a method for comparing a first digital signal and a second digital signal to generate first or second compare output signal, the first compare output signal indicating that the second input signal lags behind the first input signal, the second compare output signal indicating that the second input signal leads the first input signal, the second digital signal being originated from a third digital signal having a frequency that is higher than that of the second digital signal. The method includes the steps of: detecting the rising or falling edge of the first digital signal; generating a first synchronization signal that is the first digital signal synchronizing with the second digital signal when the rising or falling edge of the first digital signal is detected; generating a second synchronization signal lagging behind the first synchronization signal; generating a third synchronization signal lagging behind the second synchronization signal; detecting the phase difference between the first digital signal and the first synchronization signal to generate a first detection signal; generating a second detection signal indicative of the phase difference between the second and third synchronization signals; determining the phase deviation between the first and second digital signals using the second and third digital signals and the first detection signal; generating the first compare output signal when the second digital signal lags behind the first digital signal; and generating the second compare output signal when the second digital signal leads the first digital signal, wherein the second compare output signal corresponds to the second detection signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1:
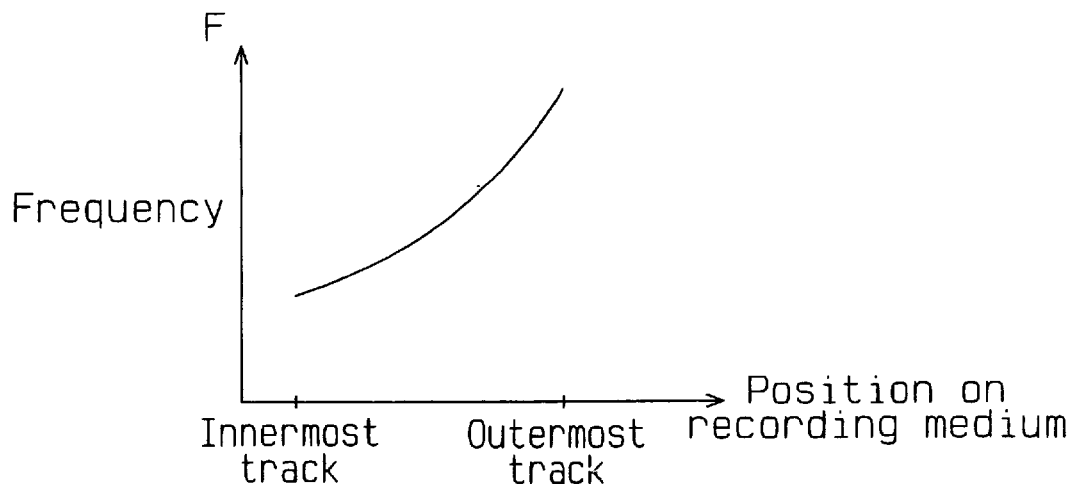
FIG. 1 is a graph illustrating the relationship between the frequency of a data signal read according to the CAV system and the reading position on a recording medium.
Figure 2:
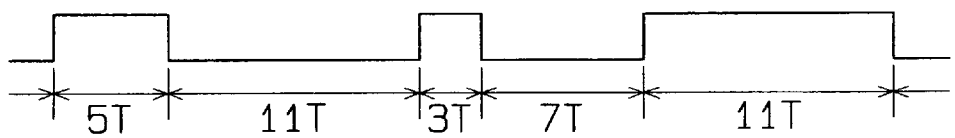
FIG. 2 shows the waveform of an EFM signal.
Figure 3:
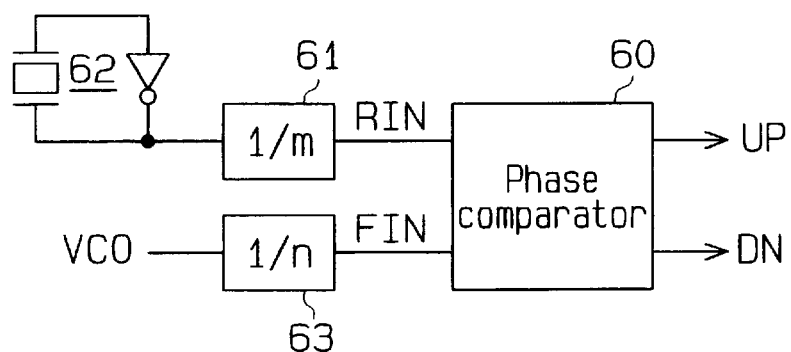
FIG. 3 is a block diagram of a phase comparator according to a first prior art.
Figure 4:
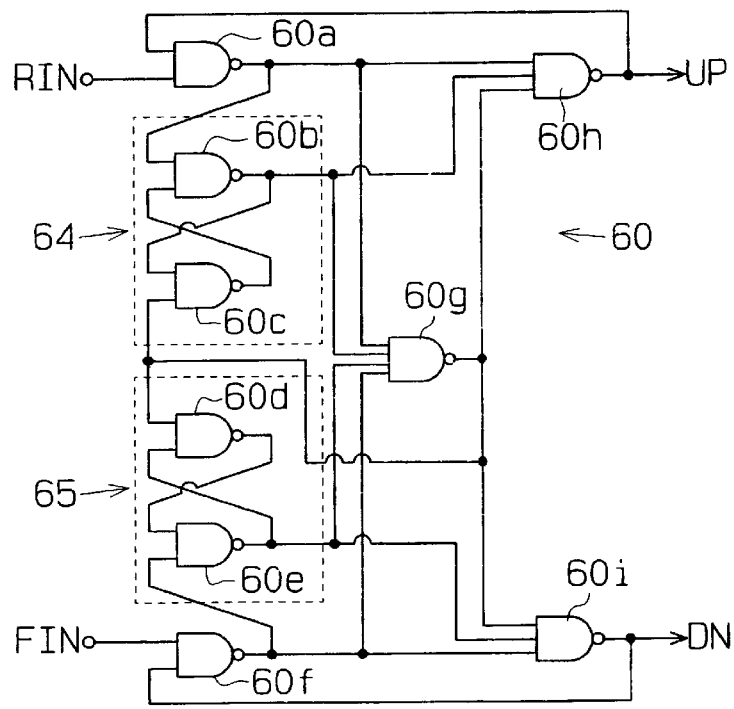
FIG. 4 is a block circuit diagram of the phase comparator according to the first prior art.
Figure 5A:
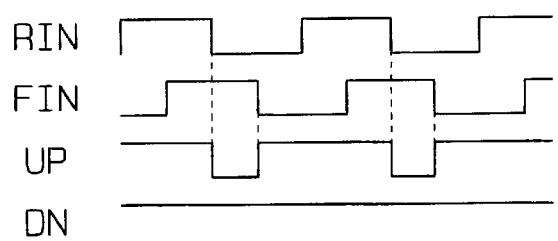
FIGS. 5A and 5B are timing charts illustrating the operation of the phase comparator according to the first prior art.
Figure 5B:
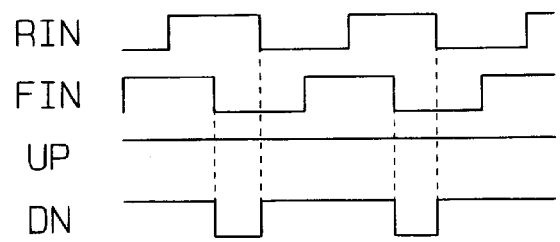
Figure 6:
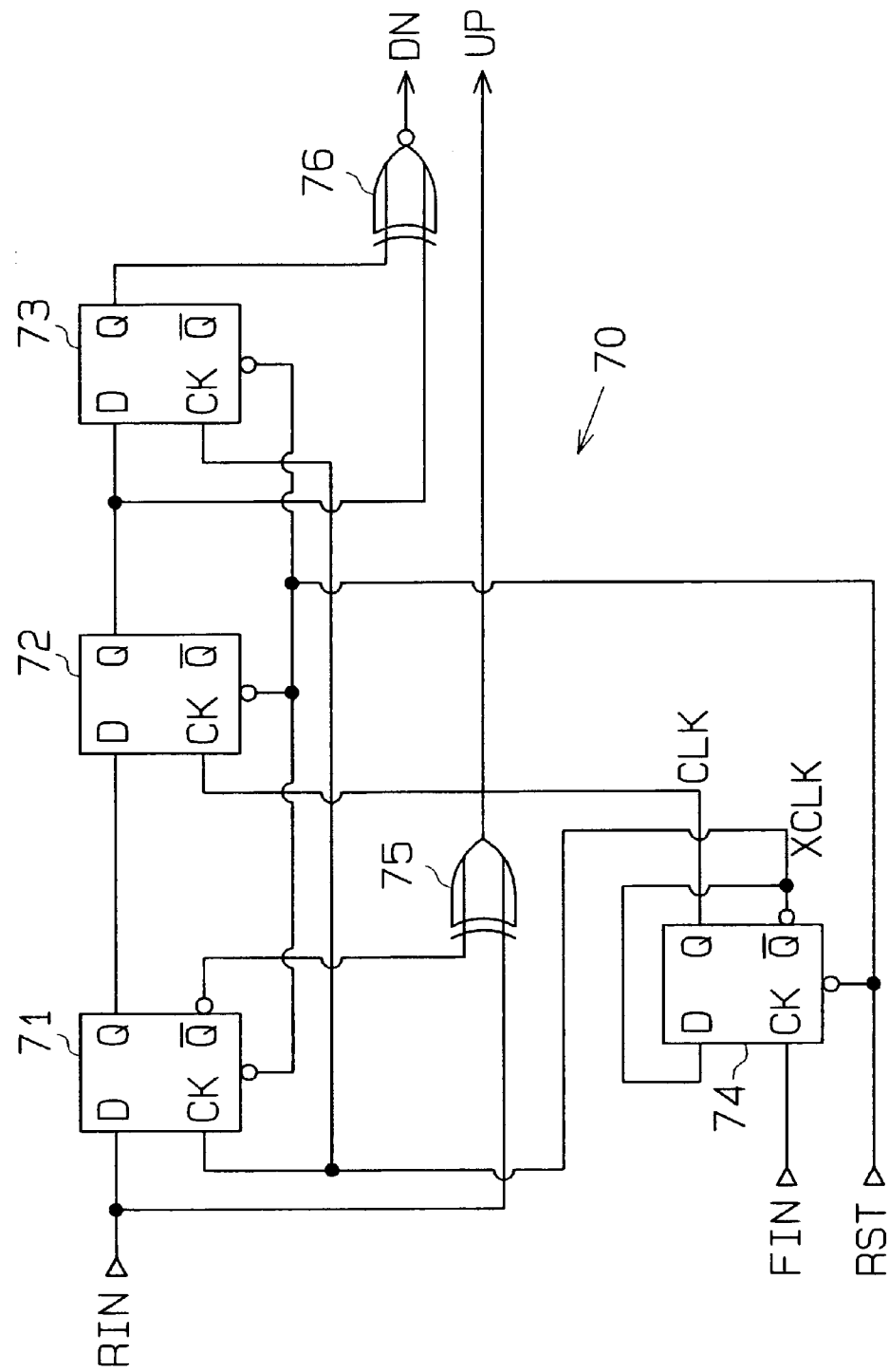
FIG. 6 is a block circuit diagram showing a phase comparator according to a second prior art.
Figure 7:
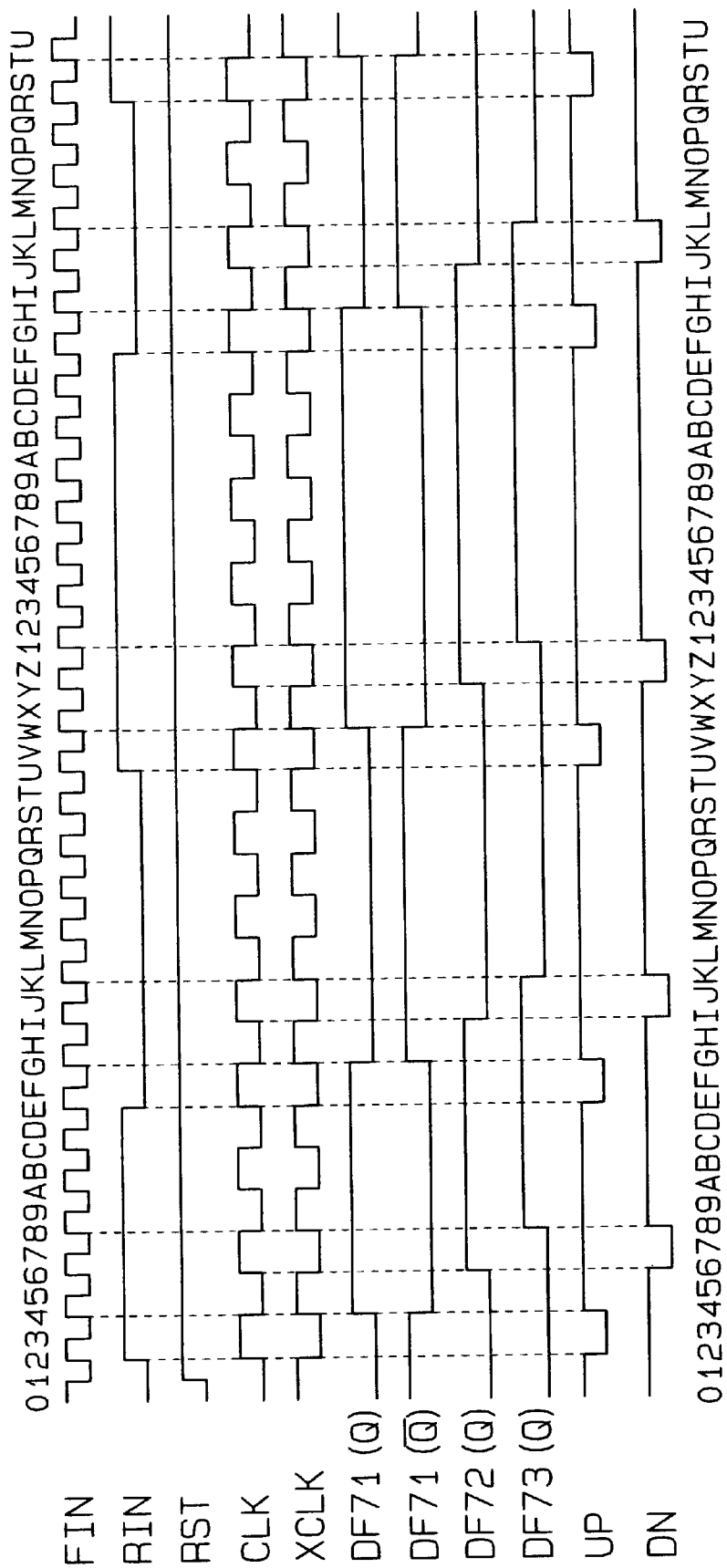
FIG. 7 is a timing chart illustrating the operation of the phase comparator when the rising of a clock coincides with the rising (falling) of a reference signal.
Figure 8:
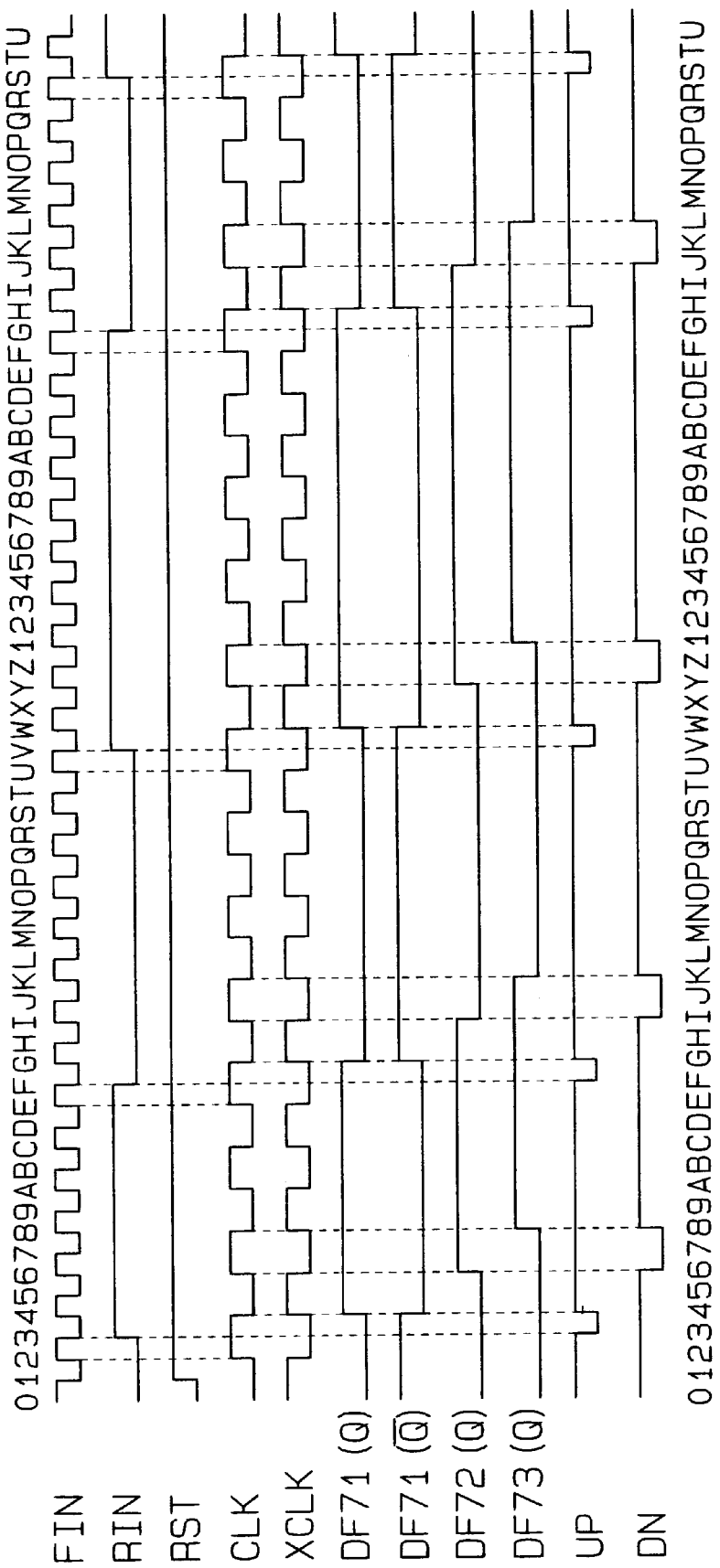
FIG. 8 is a timing chart illustrating the operation when the rising of the clock leads the rising (falling) of the reference signal.
Figure 9:
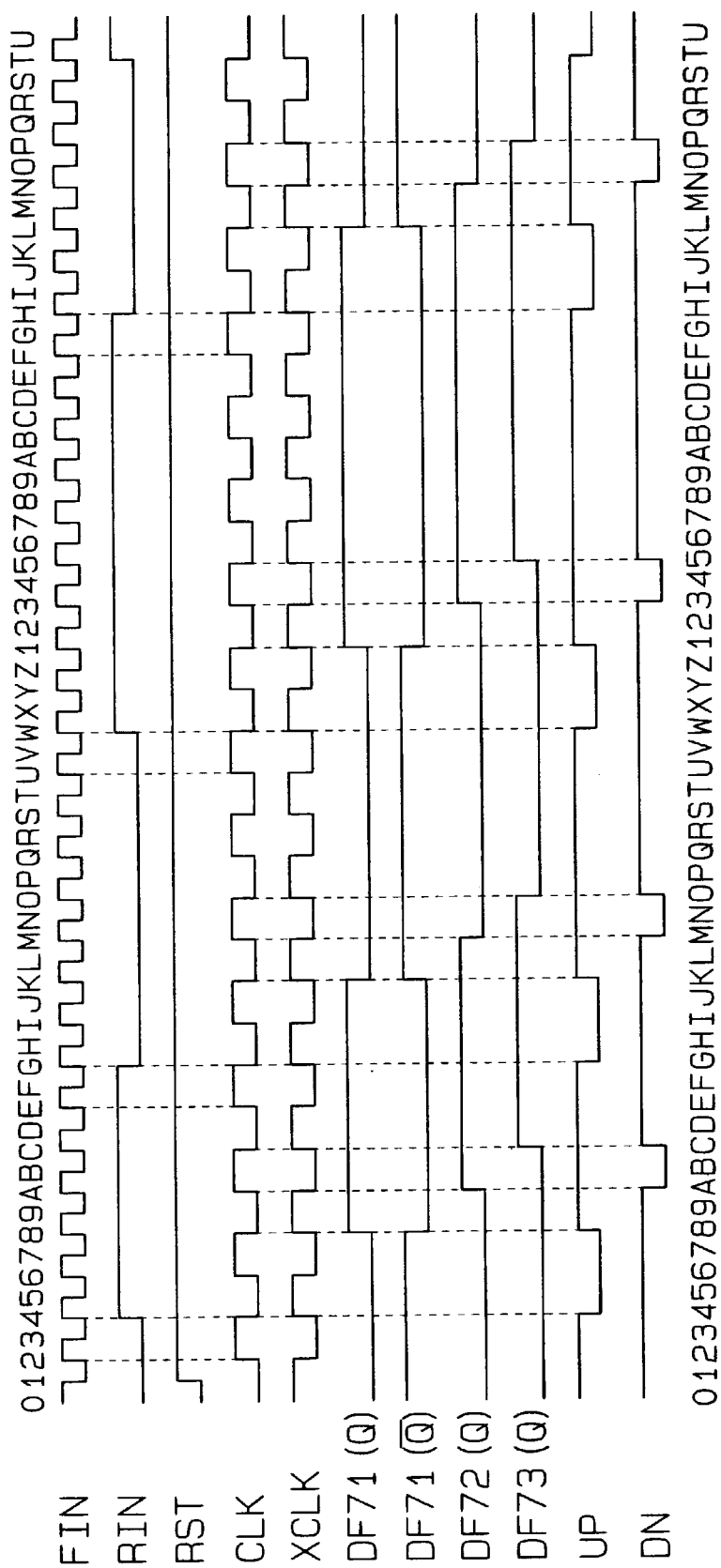
FIG. 9 is a timing chart illustrating the operation when the rising of the clock lags behind the rising (falling) of the reference signal by one period of a feedback signal.
Figure 10:
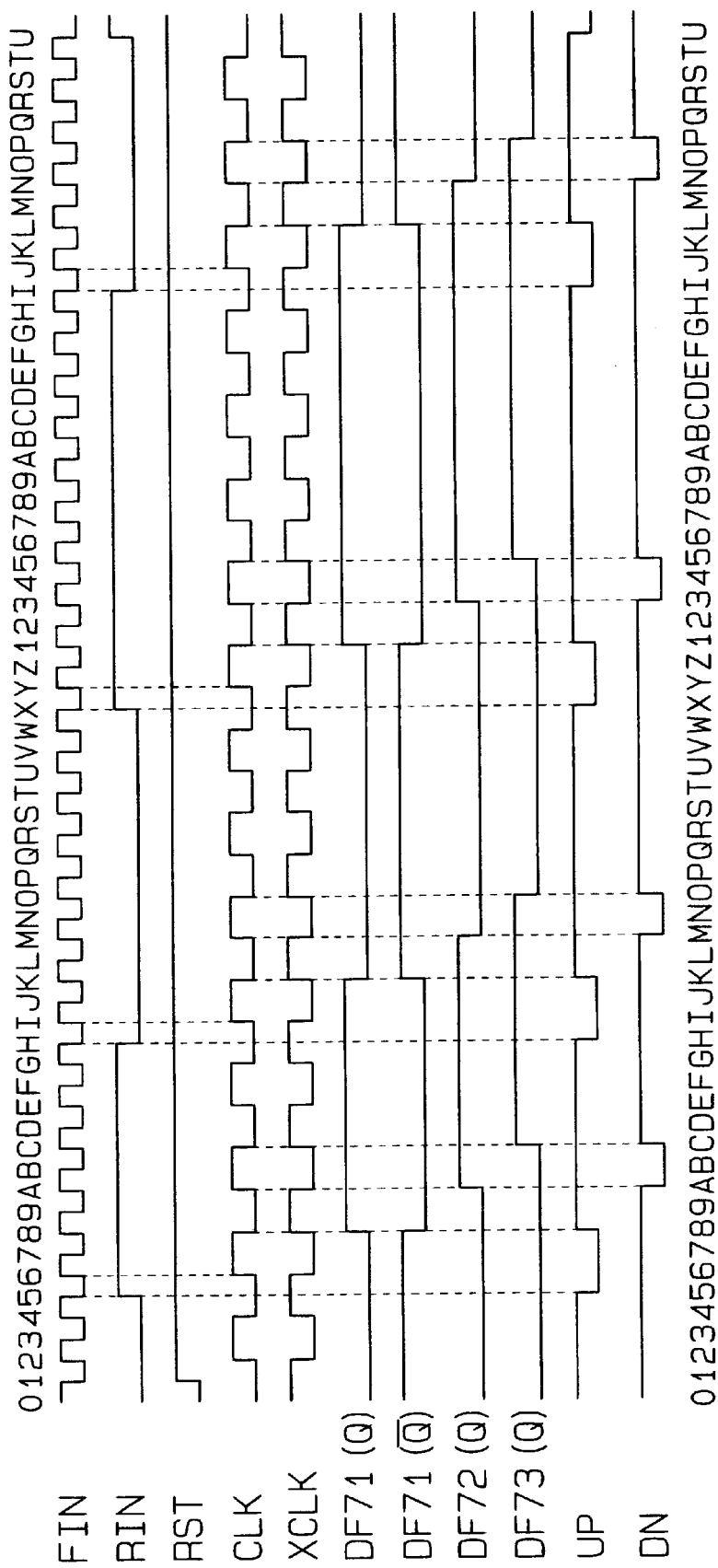
FIG. 10 is a timing chart illustrating the operation when the rising of the clock lags behind the rising (falling) of the reference signal by half the period of the feedback signal.
Figure 11:
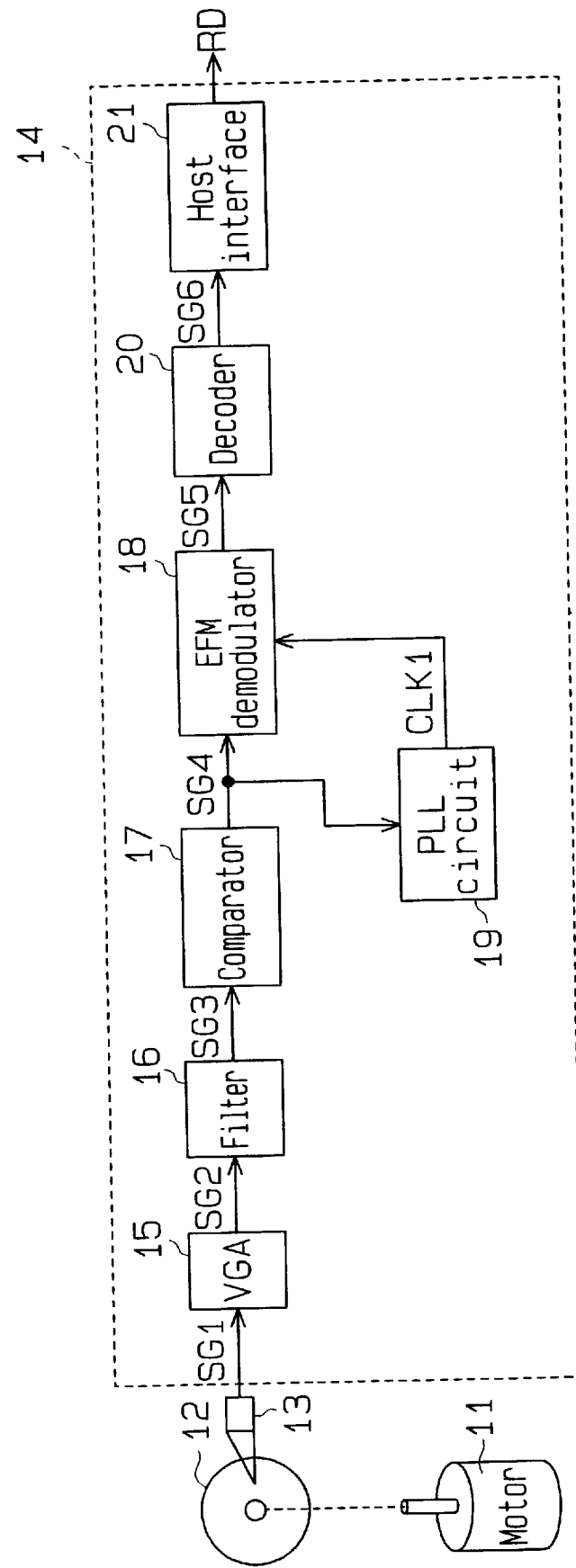
FIG. 11 is a block diagram showing a data reading apparatus according to the invention.

FIG. 11 is a block diagram showing a data reading apparatus. The data reading apparatus has a spindle motor 11, an optical disk 12 as a recording medium, a pickup device 13 and a data demodulator 14. Data is recorded on the optical disk 12 in accordance with the CLV system. At the time of reading data from the optical disk 12, the optical disk 12 is rotated at a constant number of rotations per unit time by the spindle motor 11 in accordance with the CAV system. The pickup device 13 optically reads data recorded on the optical disk 12 and supplies an analog read signal SG1 to the data demodulator 14. The data demodulator 14 demodulates the data read by the pickup device 13.

As data is read from the optical disk 12, on which the data has been recorded by the CLV system, in accordance with the CAV system, the frequency and amplitude of the analog signal SG1 change in accordance with a change in the reading position of the pickup device 13.

The data demodulator 14 has a variable gain amplifier (VGA) 15, a filter 16, a comparator 17, an EFM demodulator 18, a PLL circuit 19, a decoder 20 and a host interface 21. The data demodulator 14 may be implemented on a single semiconductor integrated circuit (IC) device chip. The PLL circuit 19 may be implemented on a single semiconductor IC device chip.

The VGA 15 receives the analog signal SG1 from the pickup device 13. The VGA 15 amplifies the analog signal SG1 and sends an output signal SG2 having a given amplitude to the filter 16. The filter 16 extracts the necessary frequency component from the output signal SG2 from the VGA 15 and sends an output signal (analog signal) SG3 having the necessary frequency component to the comparator 17.

The comparator 17 compares the amplitude of the output signal SG3 with a threshold value to convert the output signal SG3 to a binary value and supplies an EFM signal SG4 to the EFM demodulator 18 and the PLL circuit 19.

The PLL circuit 19 generates a reproduction clock CLK1 in accordance with the frequency of the EFM signal SG4 and sends the reproduction clock CLK1 to the EFM demodulator 18. The EFM demodulator 18 performs EFM demodulation on the EFM signal SG4 in accordance with the clock CLK1 and sends a demodulated digital signal SG5 to the decoder 20. The decoder 20 decodes the demodulated digital signal SG5 to produce a decode signal SG6, which is in turn output from the host interface 21 as read data RD.

Figure 12:
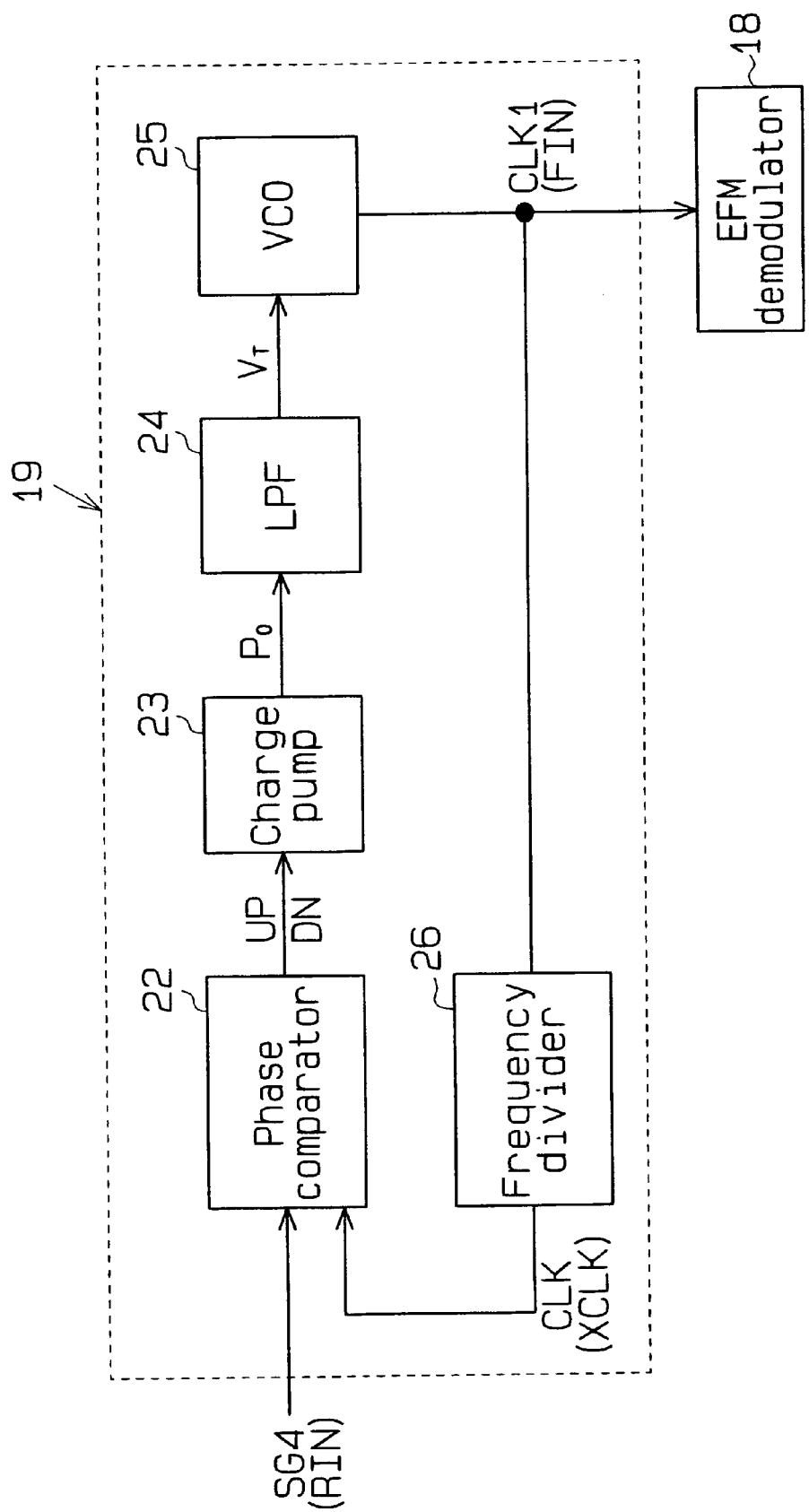
FIG. 12 is a block diagram depicting a PLL circuit in the data reading apparatus in FIG. 11.

FIG. 12 is a block diagram showing the PLL circuit 19. The PLL circuit 19 has a phase comparator 22, a charge pump 23, a low-pass filter (LPF) 24, a VCO (Voltage Controlled Oscillator) 25 and a frequency divider 26. The frequency divider 26 and the phase comparator 22 may be implemented on a single semiconductor IC device chip. The phase comparator 22 alone may be implemented on a single semiconductor IC device chip.

The phase comparator 22 receives the EFM signal SG4, which serves as a reference signal RIN, from the comparator 17 and a frequency-divided signal from the frequency divider 26. The phase comparator 22 outputs an up-signal UP or a down-signal DN to the charge pump based on the phase difference between the EFM signal SG4 and the frequency-divided signal. The charge pump 23 sends a predetermined voltage signal $P_0$ to the LPF 24 while the up-signal UP or down-signal DN of an L level is being output. The LPF 24 smooths the voltage signal $P_0$ from the charge pump 23 and sends a control voltage $V_T$, having its high frequency component removed, to the VCO 25. The VCO 25 supplies the reproduction clock CLK1, the frequency of which corresponds to the voltage of the control voltage $V_T$, to the EFM demodulator 18. The reproduction clock CLK1 is also supplied to the frequency divider 26 as a feedback signal FIN. The frequency divider 26 frequency-divides the feedback signal FIN and supplies the frequency-divided signal (clock CLK) to the phase comparator 22.

The up-signal UP is used to increase the frequency of the feedback signal FIN (reproduction clock CLK1). The down-signal DN is used to decrease the frequency of the feedback signal FIN (reproduction clock CLK1).

Figure 13:
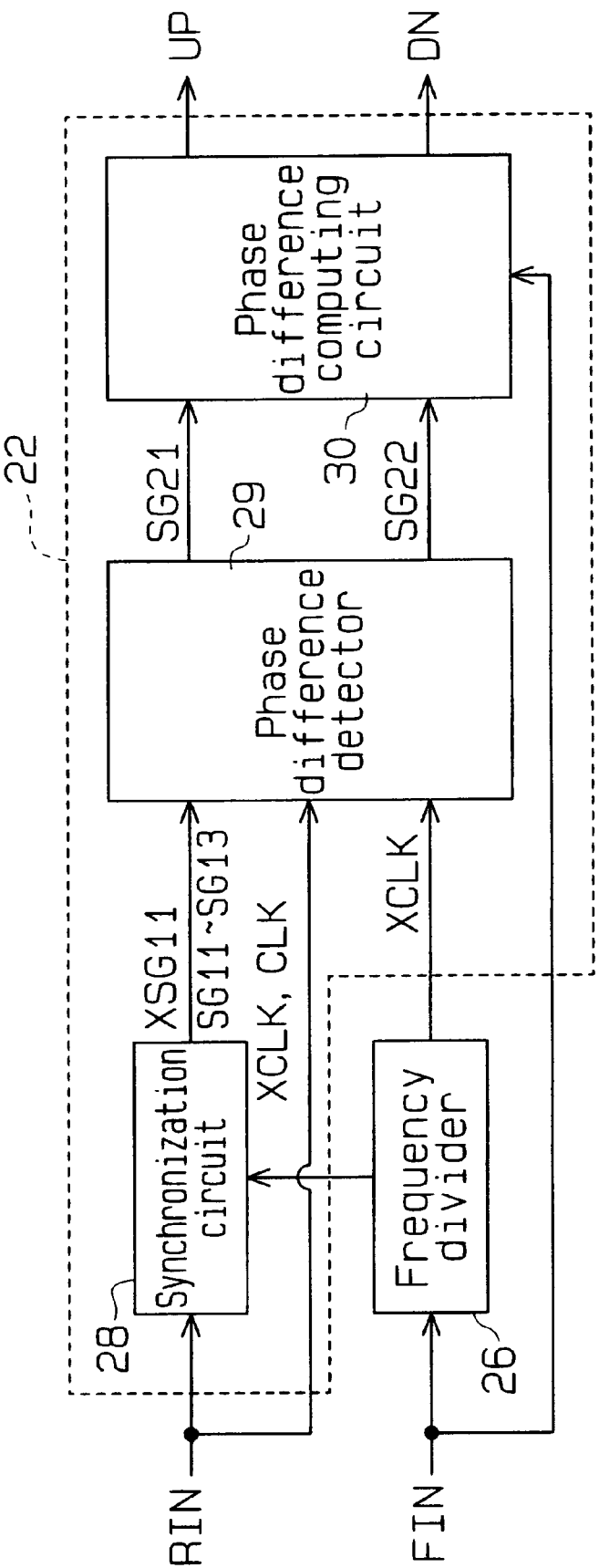
FIG. 13 is a block diagram illustrating a phase comparator of the PLL circuit in FIG. 12 according to the first embodiment of the invention.
Figure 14:
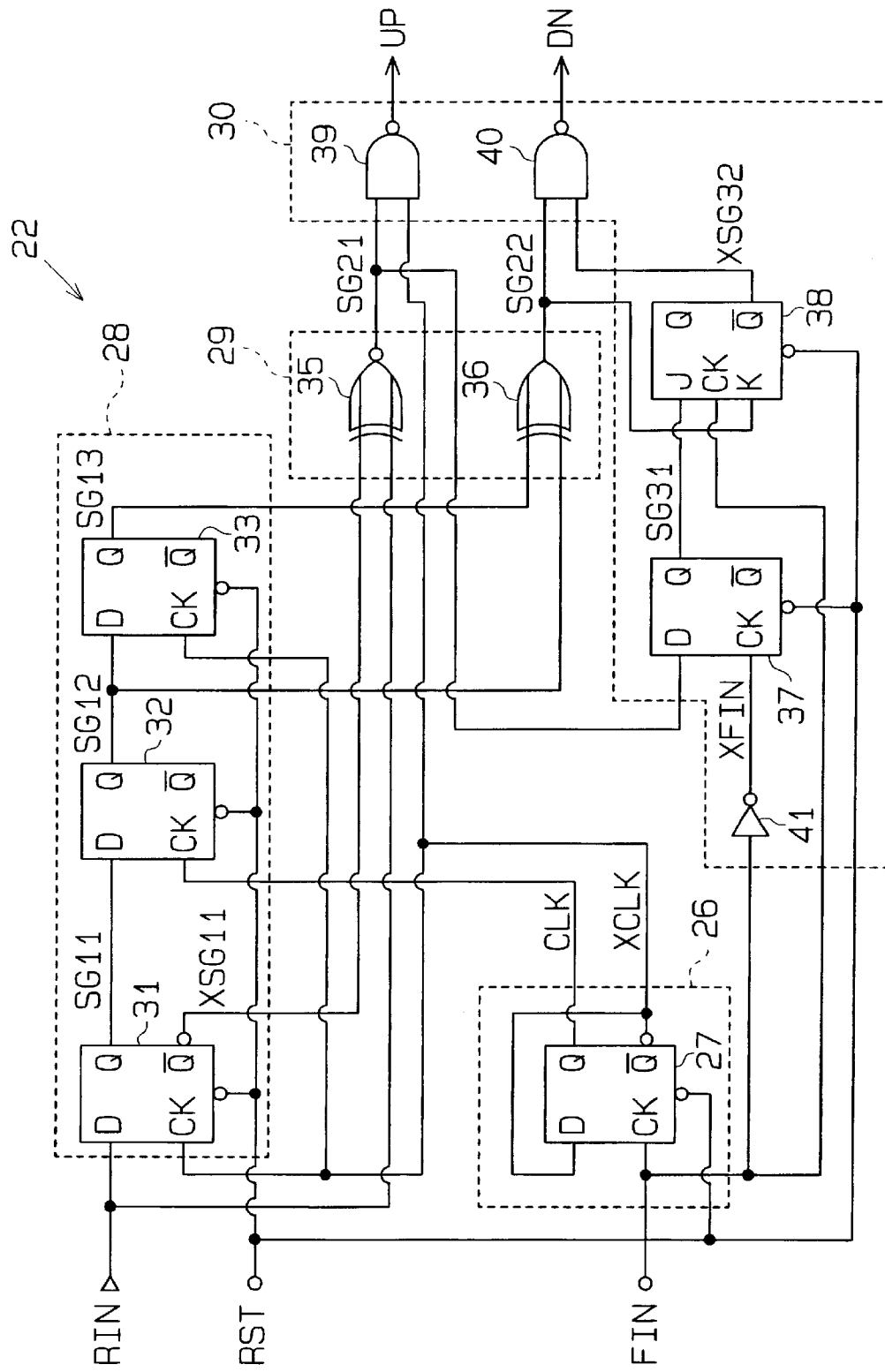
FIG. 14 is a block circuit diagram of the phase comparator in FIG. 12.

FIG. 13 is a block diagram showing the phase comparator 22. FIG. 14 is a circuit diagram of the frequency divider 26 and the phase comparator 22. As shown in FIG. 14, the frequency divider 26 includes a D flip-flop (DF) 27. The DF 27 has a clock input terminal CK for receiving the feedback signal FIN (clock CLK1), a data input terminal D, an output terminal Q for outputting a frequency-divided signal, which is obtained by frequency-dividing the feedback signal FIN by 2 and which serves as the clock CLK (see FIGS. 15 to 18), and an inverted output terminal /Q for outputting an inverted clock XCLK, which is the clock CLK inverted.

The phase comparator 22 includes a synchronizing circuit 28, a phase difference detector 29 and a phase difference computing circuit 30. The synchronization circuit 28 includes first to third D flip-flops (DFs) 31 to 33. The first DF 31 has a data input terminal D for receiving the reference signal RIN (EFM signal SG4) and a clock input terminal CK for receiving the inverted clock XCLK from the frequency divider 26. The first DF 31 sends out an output signal SG11 representing the current status (H level or L level) of the reference signal RIN from the output terminal Q in response to the rising of the inverted clock XCLK. The first DF 31 sends out an inverted output signal XSG11, which is the output signal SG11 inverted, from the inverted output terminal /Q as a sync signal.

The second DF 32 has a data input terminal D for receiving the output signal SG11 from the first DF 31 and a clock input terminal CK for receiving the clock CLK from the frequency divider 26. The second DF 32 sends out an output signal SG12 representing the current status (H level or L level) of the output signal SG11 from the output terminal Q in response to the rising of the clock CLK. The output signal SG12 lags behind the output signal SG11 by half the period of the clock CLK (one period of the feedback signal FIN).

The third DF 33 has a data input terminal D for receiving the output signal SG12 from the second DF 32 and a clock input terminal CK for receiving the inverted clock XCLK from the frequency divider 26. The third DF 33 sends out an output signal SG13 representing the current status (H level or L level) of the output signal SG12 from the output terminal Q in response to the rising of the inverted clock XCLK. The output signal SG13 lags behind the output signal SG12 by half the period of the clock CLK (one period of the feedback signal FIN).

The phase difference detector 29 includes a not exclusive-OR (NEX-OR) gate 35 and an exclusive-OR (EX-OR) gate 36. The NEX-OR gate 35 receives the inverted output signal XSG11 from the first DF 31 and the reference signal RIN (EFM signal SG4). The NEX-OR gate 35 outputs a first phase difference detection signal SG21 having an H level when the level of the inverted output signal XSG11 is the same as the level of the reference signal RIN. That is, the NEX-OR gate 35 compares the statuses of the inverted output signal SG11 and the reference signal RIN with each other to detect a phase difference between the rising of the clock CLK and the rising (or falling) of the reference signal RIN. The NEX-OR gate 35 sends out the H-level first phase difference detection signal SG21 representing this phase difference. In other words, the phase difference between the rising of the feedback signal FIN and the rising (or falling) of the reference signal RIN (EFM signal SG4) is detected by the NEX-OR gate 35. The first phase difference detection signal SG21 is supplied to the phase difference computing circuit 30.

When the H-level duration of the first phase difference detection signal SG21 is shorter than half the period of the clock CLK, the rising of the clock CLK leads the rising (or falling) of the reference signal RIN. The leading amount is determined by the time during which the first phase difference detection signal SG21 holds the H level. It is understood that when the H-level duration of the first phase difference detection signal SG21 is longer than half the period of the clock CLK, the rising of the clock CLK lags behind the rising (or falling) of the reference signal RIN. The lagging amount is determined by the time during which the first phase difference detection signal SG21 holds the H level.

This will be discussed more specifically. In response to the rising of the inverted clock XCLK, the first DF 31 outputs the output signal SG11 indicating the current status of the reference signal RIN from the output terminal Q and sends out the inverted output signal XSG11, which is the output signal SG11 inverted, from the inverted output terminal /Q. Therefore, the rising of the reference signal RIN to the H level from the L level (or the falling to the L level from the H level) is detected by the inverting action of the first DF 31. The first DF 31 detects this rising or falling in a time equal to or smaller than one period of the clock CLK.

Case A (see FIG. 15): This is case where the rising of the clock CLK coincides with the rising (or falling) of the reference signal RIN. In this case A, the first DF 31 performs inversion when the inverted clock XCLK rises after half the period of the clock CLK has passed since the rising of the reference signal RIN. During the period from the rising of the reference signal RIN to the passing of half the period of the clock CLK, therefore, the first DF 31 outputs the inverted output signal XSG11 having the same level (H level or L level) as that of the reference signal RIN. As a result, the NEX-OR gate 35 outputs the H-level first phase difference detection signal SG21 during the period from the rising (or falling) of the reference signal RIN to the passing of half the period of the clock CLK in case A.

Case B (see FIG. 16): This is case where the rising of the clock CLK leads the rising (or falling) of the reference signal RIN. In this case B, the inverted clock XCLK rises when a time shorter than half the period of the clock CLK passes since the rising (or falling) of the reference signal RIN. Therefore, the first DF 31 performs the inverting action earlier than in case A. During the period in which a time shorter than half the period of the clock CLK passes since the rising (or falling) of the reference signal RIN, therefore, the first DF 31 outputs the inverted output signal XSG11 having the same level (H level or L level) as that of the reference signal RIN. Consequently, in case B, the NEX-OR gate 35 outputs the H-level first phase difference detection signal SG21 while a time shorter than half the period of the clock CLK passes since the rising (or falling) of the reference signal RIN.

Case C (see FIG. 17 or 18): This is case where the rising of the clock CLK lags behind the rising (or falling) of the reference signal RIN. In this case C, the inverted clock XCLK rises after the inverted clock XCLK rises when a time longer than half the period of the clock CLK passes since the rising (or falling) of the reference signal RIN. Therefore, the first DF 31 performs the inverting action later than in case A. During the period in which a time longer than half the period of the clock CLK passes since the rising (or falling) of the reference signal RIN, therefore, the first DF 31 outputs the inverted output signal XSG11 having the same level (H level or L level) as that of the reference signal RIN. As a result, in case C, the NEX-OR gate 35 outputs the H-level first phase difference detection signal SG21 while a time longer than half the period of the clock CLK passes since the rising (or falling) of the reference signal RIN.

The EX-OR gate 36 receives the output signal SG12 of the second DF 32 and the output signal SG13 of the third DF 33. The EX-OR gate 36 outputs a second phase difference detection signal SG22 of an L level when the levels of both output signals SG12 and SG13 match with each other. In other words, the EX-OR gate 36 outputs the second phase difference detection signal SG22 of an H level when the levels of both output signals SG12 and SG13 differ from each other. The second phase difference detection signal SG22 is used in the generation of the L-level down-signal DN by the phase difference computing circuit 30.

The phase difference computing circuit 30 includes a D flip-flop (DF) 37, a JK flip-flop (JKF) 38, two NAND gates 39 and 40 and an inverter 41. The phase difference computing circuit 30 computes a phase difference of the rising (or falling) of the reference signal RIN with respect to the rising of the clock CLK based on the first and second phase difference detection signals SG21 and SG22. In case A in FIG. 15, the phase difference computing circuit 30 outputs the H-level up-signal UP and down-signal DN. The phase difference computing circuit 30 outputs the L-level down-signal DN for half the period of the clock CLK in case B in FIG. 16. In case C in FIGS. 17 and 18, the phase difference computing circuit 30 outputs the L-level up-signal UP for a time corresponding to the phase difference.

The NAND gate 39 receives the first phase difference detection signal SG21 and the inverted clock XCLK and outputs the L-level up-signal UP when the first phase difference detection signal SG21 and the inverted clock XCLK both have H levels. The NAND gate 39 compares the first phase difference detection signal SG21 with the inverted clock XCLK to compute the delay time of the rising of the clock CLK with respect to the rising (or falling) of the reference signal RIN, and it outputs the L-level up-signal UP during the delay time.

This will be discussed more specifically. In case C shown in FIG. 17, for example, the first phase difference detection signal SG21 rises to the H level more quickly than the clock CLK does. While there is a delay in the clock CLK, therefore, the first phase difference detection signal SG21 and the inverted clock XCLK both have H levels. As a result, the L-level up-signal UP is output while the H level is maintained.

Figure 15:
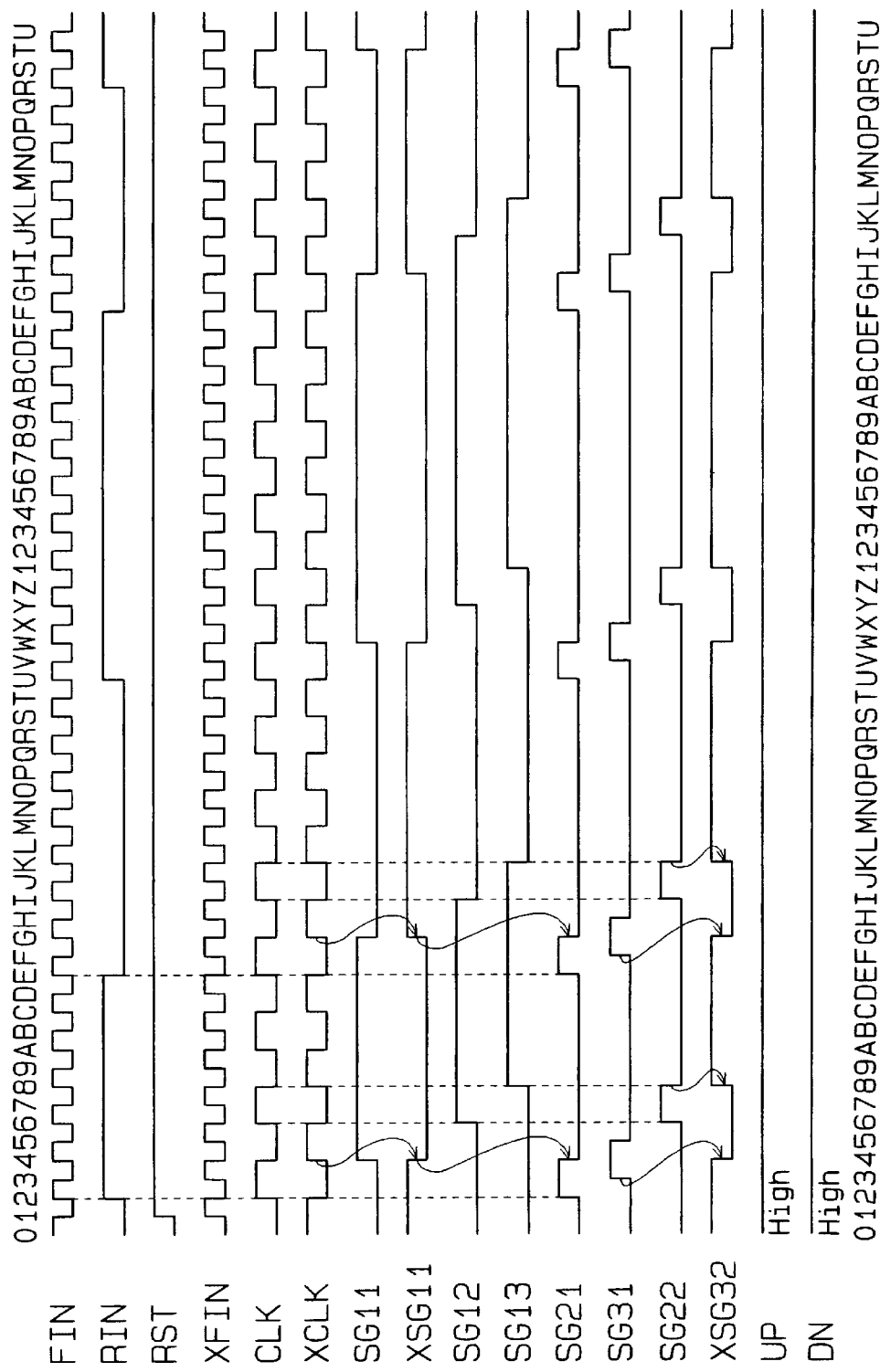
FIG. 15 is a timing chart illustrating the operation of the phase comparator when the rising of a clock coincides with the rising (falling) of a reference signal.

In case A shown in FIG. 15, there exists no time in which the first phase difference detection signal SG21 and the inverted clock XCLK both have H levels. As a result, the H-level up-signal UP is maintained.

Figure 16:
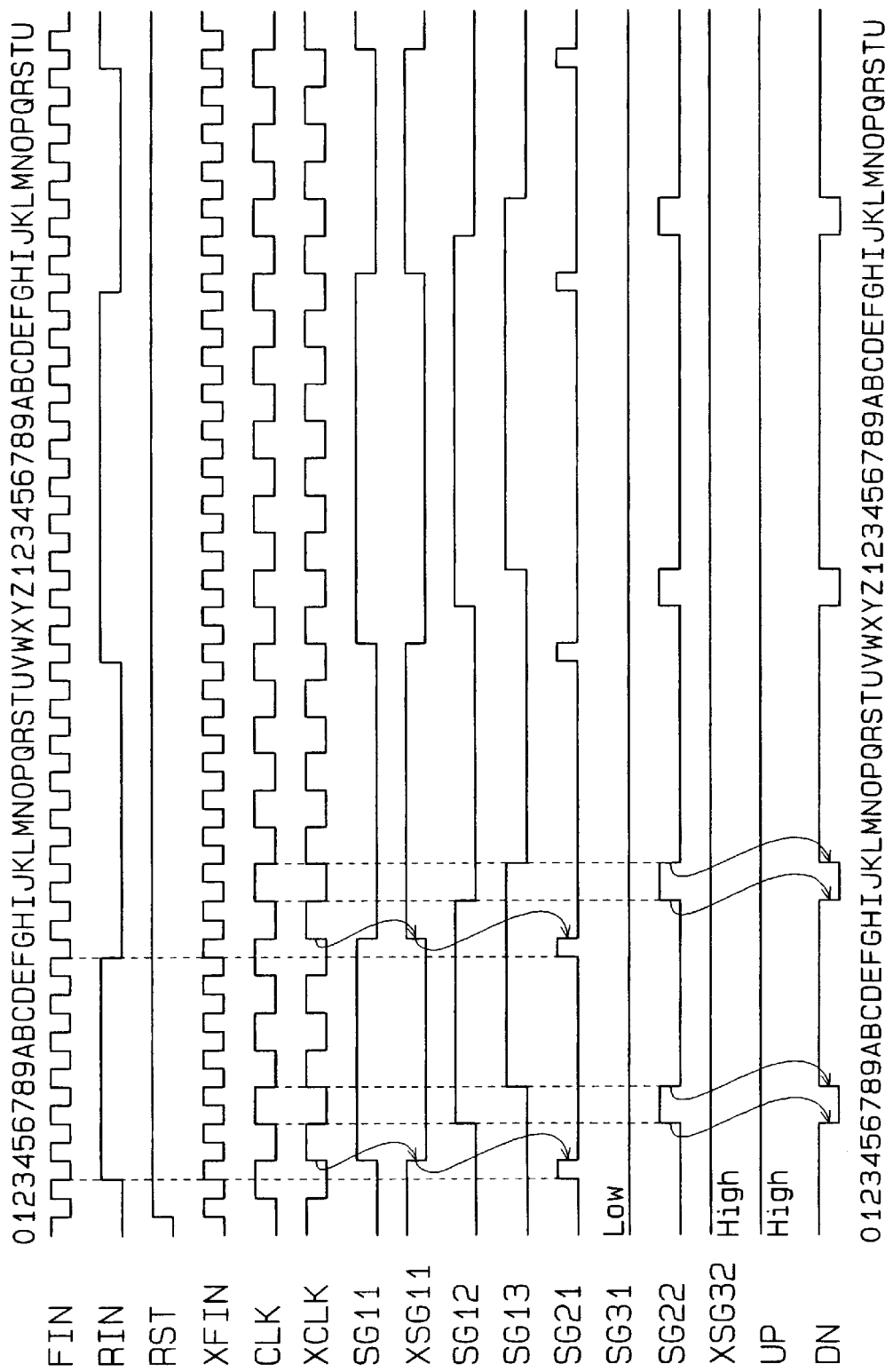
FIG. 16 is a timing chart illustrating the operation when the rising of the clock leads the rising (falling) of the reference signal.

In case B shown in FIG. 16, the first phase difference detection signal SG21 also falls to the L level quickly. In other words, the first phase difference detection signal SG21 falls before the inverted clock XCLK rises. Therefore, neither the first phase difference detection signal SG21 nor the inverted clock XCLK has an H level. Consequently, the H-level up-signal UP is maintained.

Referring again to FIG. 14, the DF 37 has a data input terminal D for receiving the first phase difference detection signal SG21 and a clock input terminal CK for receiving an inverted feedback signal XFIN inverted by an inverter 41. The DF 37 outputs an output signal SG31 representing the current status (H level or L level) of the first phase difference detection signal SG21 from the output terminal Q in response to the rising of the inverted feedback signal XFIN. This output signal SG31 is the first phase difference detection signal SG21 which is delayed by half the period of the feedback signal FIN. Therefore, neither the first phase difference detection signal SG21 nor the inverted clock XCLK has an H level. Consequently, the H-level up-signal UP is maintained.

In case B shown in FIG. 16, the DF 37 outputs the L-level output signal SG31. That is, the DF 37 discriminates whether or not the rising of the clock CLK is earlier than the rising (or falling) of the reference signal RIN and outputs the H-level output signal SG31 only when the rising of the clock CLK happens later than the rising (or falling) of the reference signal RIN.

When the H-level duration of the first phase difference detection signal SG21 is shorter than one period of the feedback signal FIN, for example, as shown in FIG. 16, the DF 37 does not output the output signal SG31 corresponding to the detection signal SG21. This is because the DF 37 receives the L-level first phase difference detection signal SG21 in response to the rising of the feedback signal FIN.

Figure 17:
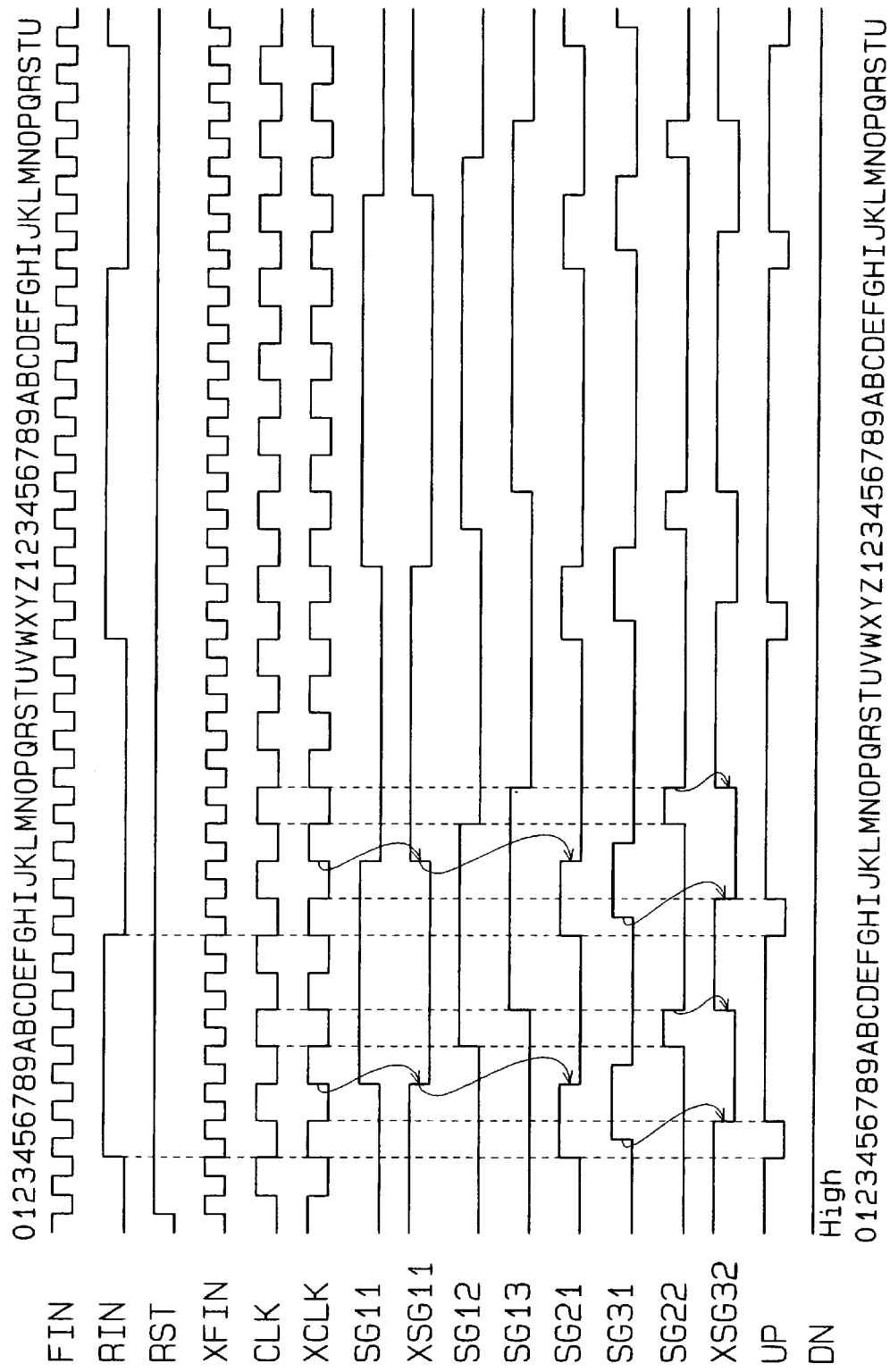
FIG. 17 is a timing chart illustrating the operation when the rising of the clock lags behind the rising (falling) of the reference signal by one period of a feedback signal.
Figure 18:
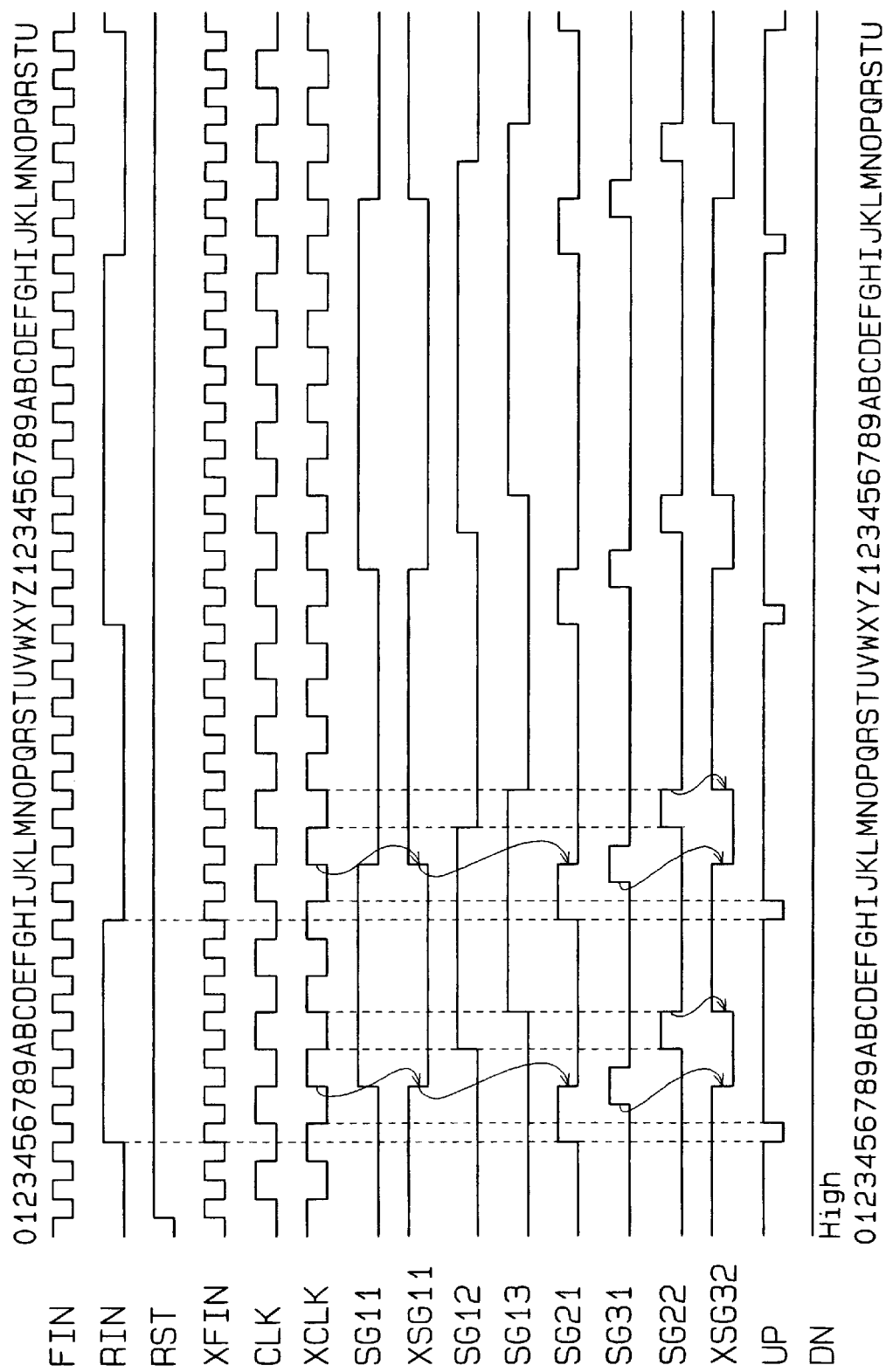
FIG. 18 is a timing chart illustrating the operation when the rising of the clock lags behind the rising (falling) of the reference signal by half the period of the feedback signal.

When the first phase difference detection signal SG21 is holding the H level for one period of the feedback signal FIN or longer as shown in FIGS. 15, 17 and 18, the DF 37 sends out the H-level output signal SG31 corresponding to the phase difference detection signal SG21.

Referring again to FIG. 14, the JKF 38 has an input terminal J for receiving the output signal SG31 and an input terminal K for receiving a second phase difference detection signal SG22. The JKF 38 further has a clock input terminal CK for receiving the feedback signal FIN and an inverted output terminal /Q, which is connected to the input terminal of the NAND gate 40 and from which an inverted output signal XSG32 is output.

The JKF 38 outputs the inverted output signal XSG32 based on the statuses of both the output signal SG31 and the second phase difference detection signal SG22 in response to the rising of the feedback signal FIN. That is, when the output signal SG31 and the second phase difference detection signal SG22 both have L levels, the inverted output signal XSG32 does not change. When the output signal SG31 has the L level and the second phase difference detection signal SG22 has the H level, the H-level inverted output signal XSG32 is output. When the output signal SG31 has the H level and the second phase difference detection signal SG22 has the L level, the L-level inverted output signal XSG32 is output. When the output signal SG31 and the second phase difference detection signal SG22 both have the H levels, the inverted output signal XSG32 is inverted.

In case B shown in FIG. 16, for example, the JKF 38 keeps outputting the H-level inverted output signal XSG32 without performing inversion. That is, the JKF 38 supplies the H-level inverted output signal XSG32 to the NAND gate 40 even while the H-level second phase difference detection signal SG22 is output.

In case C in shown in FIGS. 17 and 18 or case A in FIG. 15, the JKF 38 performs inversion. The inverted output signal XSG32 falls to the L level in response to the first rising of the feedback signal FIN after the rising of the output signal SG31. The inverted output signal XSG32 then rises to the H level at the same time as the second phase difference detection signal SG22 falls. That is, the JKF 38 supplies the L-level inverted output signal XSG32 to the NAND gate 40 for the output duration of the H-level second phase difference detection signal SG22 or longer.

The NAND gate 40 receives the second phase difference detection signal SG22 and the inverted output signal XSG32, and outputs the L-level down-signal DN when both signals XSG32 and SG22 have H levels. That is, the NAND gate 40 compares the inverted output signal XSG32 with the second phase difference detection signal SG22 to detect if the rising of the clock CLK is earlier than the rising (or falling) of the reference signal RIN. When the rising of the reference signal RIN is earlier (case A in FIG. 15), the NAND gate 40 outputs the L-level down-signal DN in response to the H-level inverted output signal XSG32 while the second phase difference detection signal SG22 is holding the H level (half the period of the clock CLK). In case C in FIGS. 17 and 18 and case A in FIG. 15, the NAND gate 40 outputs the H-level down-signal DN in response to the L-level inverted output signal XSG32 regardless of the level of the second phase difference detection signal SG22.

Case-by-case functions of the phase comparator 22 will now be described.

Case A1

Case A1 where the rising of the clock CLK matches with the rising of the reference signal RIN will now be discussed with reference to FIG. 15.

In case A1, the phase comparator 22 outputs the H-level up-signal UP and down-signal DN. The first DF 31 performs inversion when the inverted clock XCLK rises after half the period of the clock CLK has passed since the rising of the reference signal RIN (the falling of the inverted clock XCLK). As a result, the inverted output signal XSG11 falls to the L level from the H level.

The NEX-OR gate 35 causes the first phase difference detection signal SG21 to rise in response to the rising of the reference signal RIN and causes the first phase difference detection signal SG21 to fall in response to the falling of the inverted output signal XSG11. While the H-level first phase difference detection signal SG21 is output, the inverted clock XCLK keeps the L level. The NAND gate 39 therefore keeps outputting the H-level up-signal UP.

The DF 37 sends the output signal SG31, which is delayed from the first phase difference detection signal SG21 by half the period of the feedback signal FIN, to the JKF 38. The JKF 38 receives the H-level output signal SG31 and sends out the L-level inverted output signal XSG32.

The EX-OR gate 36 outputs the H-level second phase difference detection signal SG22 for half the period of the clock CLK in response to the rising of the next clock CLK from the clock CLK that rose at the same time as the reference signal RIN rose. However, the JKF 38 keeps outputting the L-level inverted output signal XSG32 for the output duration of the H-level second phase difference detection signal SG22 or longer. Thus, the NAND gate 40 keeps outputting the H-level down-signal DN.

Case A2

Case A2 where the rising of the clock CLK matches with the falling of the reference signal RIN will be discussed below with reference to FIG. 15.

In case A2, as in case A1, the phase comparator 22 outputs the H-level up-signal UP and down-signal DN. The first DF 31 performs inversion when the inverted clock XCLK rises after half the period of the clock CLK has passed since the falling of the reference signal RIN (the rising of the inverted clock XCLK). As a result, the inverted output signal XSG11 rises to the H level from the L level.

The first phase difference detection signal SG21 rises in response to the falling of the reference signal RIN and falls in response to the rising of the inverted output signal XSG11. During the output duration of the H-level first phase difference detection signal SG21, the inverted clock XCLK keeps the L level. Therefore, the H-level up-signal UP is maintained.

The DF 37 sends the output signal SG31, which is delayed from the first phase difference detection signal SG21 by half the period of the feedback signal FIN, to the JKF 38. The JKF 38 receives the H-level output signal SG31 and sends out the L-level inverted output signal XSG32.

The EX-OR gate 36 outputs the H-level second phase difference detection signal SG22 for half the period of the clock CLK in response to the rising of the next clock CLK after the clock CLK that fell at the same time as the reference signal RIN rose. However, the JKF 38 keeps outputting the L-level inverted output signal XSG32 for the output duration of the H-level second phase difference detection signal SG22 or longer. Thus, the NAND gate 40 keeps outputting the H-level down-signal DN.

Case B1

Case B1 where the rising of the clock CLK leads the rising of the reference signal RIN by half the period of the feedback signal FIN will now be discussed with reference to FIG. 16. In this case B1, the phase comparator 22 outputs the L-level down-signal DN.

The first DF 31 performs inversion when the inverted clock XCLK rises after the rising of the reference signal RIN. As a result, the inverted output signal XSG11 falls after half the period of the feedback signal FIN has passed since the rising of the reference signal RIN.

The NEX-OR gate 35 causes the first phase difference detection signal SG21 to rise in response to the rising of the reference signal RIN and causes the first phase difference detection signal SG21 to fall in response to the falling of the inverted output signal XSG11. The first phase difference detection signal SG21 holds the H level for half the period of the feedback signal FIN. During the output duration of the H-level first phase difference detection signal SG21, the inverted clock XCLK keeps the L level. The NAND gate 39 therefore keeps outputting the H-level up-signal UP.

The DF 37 receives the H-level first phase difference detection signal SG21 and sends the L-level output signal SG31 to the JKF 38. The reason why the DF 37 outputs the L-level output signal SG31 is that the inverted feedback signal XFIN is holding the H level for half the period. The JKF 38 receives the L-level output signal SG31 and the L-level second phase difference detection signal SG22 and sends the H-level inverted output signal XSG32 to the NAND gate 40.

The EX-OR gate 36 supplies the H-level second phase difference detection signal SG22 to the NAND gate 40 for half the period of the clock CLK in response to the first rising of the clock CLK after the rising of the reference signal RIN. The NAND gate 40 outputs the L-level down-signal DN for one period of the feedback signal FIN in response to the H-level second phase difference detection signal SG22.

Case B2

Case B2 where the rising of the clock CLK leads the falling of the reference signal RIN by half the period of the feedback signal FIN will now be discussed with reference to FIG. 16. In this case B2, as in case B1, the phase comparator 22 outputs the L-level down-signal DN.

The first DF 31 performs inversion when the inverted clock XCLK rises after the falling of the reference signal RIN. As a result, the inverted output signal XSG11 rises after half the period of the feedback signal FIN has passed since the falling of the reference signal RIN.

The NEX-OR gate 35 causes the first phase difference detection signal SG21 to rise in response to the falling of the reference signal RIN and causes the first phase difference detection signal SG21 to fall in response to the rising of the inverted output signal XSG11. The first phase difference detection signal SG21 therefore holds the H level for half the period of the feedback signal FIN. During the output duration of the H-level first phase difference detection signal SG21, the inverted clock XCLK keeps the L level. The NAND gate 39 therefore keeps outputting the H-level up-signal UP.

The DF 37 receives the H-level first phase difference detection signal SG21 and the H-level inverted feedback signal XFIN and sends the L-level output signal SG31 to the JKF 38. The JKF 38 receives the L-level second phase difference detection signal SG22 and the L-level output signal SG31 and sends the H-level inverted output signal XSG32 to the NAND gate 40.

The EX-OR gate 36 supplies the H-level second phase difference detection signal SG22 to the NAND gate 40 for half the period of the clock CLK in response to the first rising of the clock CLK after the falling of the reference signal RIN. The NAND gate 40 outputs the L-level down-signal DN for one period of the feedback signal FIN in response to the H-level second phase difference detection signal SG22.

Case C1

Case C1 where the rising of the clock CLK lags behind the rising of the reference signal RIN by one period of the feedback signal FIN will now be discussed with reference to FIG. 17. In this case C1, the phase comparator 22 outputs the L-level up-signal UP for one period of the feedback signal FIN.

The first DF 31 performs inversion when the next inverted clock XCLK rises after the rising of the reference signal RIN (the rising of the inverted clock XCLK). As a result, the inverted output signal XSG11 falls after two periods of the feedback signal FIN have passed since the rising of the reference signal RIN.

The NEX-OR gate 35 causes the first phase difference detection signal SG21 to rise in response to the rising of the reference signal RIN and causes the first phase difference detection signal SG21 to fall in response to the falling of the inverted output signal XSG11. The first phase difference detection signal SG21 therefore holds the H level for two periods of the feedback signal FIN. For a period from the rising of the reference signal RIN to the passing of one period of the feedback signal FIN during the output duration of the H-level first phase difference detection signal SG21, the inverted clock XCLK keeps the H level. The NAND gate 39 therefore keeps outputting the L-level up-signal UP for the output duration of the H-level inverted clock XCLK.

The DF 37 receives the H-level first phase difference detection signal SG21 and sends the H-level output signal SG31 to the JKF 38 for two periods of the feedback signal FIN. The JKF 38 receives the H-level output signal SG31 and sends the L-level inverted output signal XSG32 to the NAND gate 40.

The EX-OR gate 36 supplies the H-level second phase difference detection signal SG22 to the NAND gate 40 for half the period of the clock CLK in response to the next rising of the clock CLK after the rising of the reference signal RIN. However, the JKF 38 is holding the inverted output signal XSG32 at the L level during the output duration of the H-level second phase difference detection signal SG22. The NAND gate 40 thus keeps outputting the H-level down-signal DN.

When the rising of the clock CLK lags behind the rising of the reference signal RIN by half the period of the feedback signal FIN, as shown in FIG. 18, the phase comparator 22 outputs the L-level up-signal UP for half the period of the feedback signal FIN. Further, the phase comparator 22 keeps outputting the H-level down-signal DN.

Case C2

Case C2 where the rising of the clock CLK lags behind the falling of the reference signal RIN by one period of the feedback signal FIN will be discussed below with reference to FIG. 17. In this case C2, as in case C1, the phase comparator 22 outputs the L-level up-signal UP for one period of the feedback signal FIN.

The first DF 31 performs inversion when the next inverted clock XCLK rises after the falling of the reference signal RIN (the rising of the inverted clock XCLK). As a result, the inverted output signal XSG11 rises after two periods of the feedback signal FIN have passed since the falling of the reference signal RIN.

The NEX-OR gate 35 causes the first phase difference detection signal SG21 to rise in response to the falling of the reference signal RIN and causes the first phase difference detection signal SG21 to fall in response to the rising of the inverted output signal XSG11. The first phase difference detection signal SG21 therefore holds the H level for two periods of the feedback signal FIN. For a period from the falling of the reference signal RIN to the passing of one period of the feedback signal FIN during the output duration of the H-level first phase difference detection signal SG21, the inverted clock XCLK keeps the H level. The NAND gate 39 therefore keeps outputting the L-level up-signal UP for the output duration of the H-level inverted clock XCLK.

The DF 37 receives the H-level first phase difference detection signal SG21 and sends the H-level output signal SG31 to the JKF 38 for two periods of the feedback signal FIN. The JKF 38 receives the H-level output signal SG31 and sends the L-level inverted output signal XSG32 to the NAND gate 40.

The EX-OR gate 36 supplies the H-level second phase difference detection signal SG22 to the NAND gate 40 for half the period of the clock CLK in response to the next rising of the clock CLK after the falling of the reference signal RIN. However, the JKF 38 is holding the inverted output signal XSG32 at the L level during the output duration of the H-level second phase difference detection signal SG22. The NAND gate 40 thus keeps outputting the H-level down-signal DN.

When the rising of the clock CLK lags behind the falling of the reference signal RIN by half the period of the feedback signal FIN, as shown in FIG. 18, the phase comparator 22 outputs the L-level up-signal UP for half the period of the feedback signal FIN. Further, the phase comparator 22 keeps outputting the H-level down-signal DN.

The first embodiment has the following advantages.

(1) The phase comparator 22 can perform phase comparison between the rising (falling) of the reference signal RIN (EFM signal SG4) and the rising of the clock CLK (feedback signal FIN). This phase comparison permits locking of the PLL circuit 19 in accordance with a variation in the frequency of the reference signal RIN (EFM signal SG4).

(2) In the locked state in case A (case A1 and case A2), the phase comparator 22 keeps outputting the H-level up-signal UP and down-signal DN. In other words, the phase comparator 22 does not alternately output the L-level up-signal UP and the L-level down-signal DN in the locked state. Therefore, the charge pump 23 and the VCO 25 keep the current operational statuses, thus stabilizing the frequency-locked state of the PLL circuit 19.

(3) The data reading apparatus according to the CAV system is equipped with the PLL circuit 19 which has a reliable and stable locked state. The EFM demodulator 18 in the data demodulator 14 can therefore accurately demodulate data which has been recorded on an optical disk according to the CLV system. The data reading apparatus according to this embodiment can thus adequately read data recorded in accordance with the CLV system as well as the CAV system.

(4) The first DF 31 in the synchronization circuit 28 holds the status of the reference signal RIN in response to the rising of the inverted clock XCLK. Accordingly, the rising and falling of the reference signal RIN are detected. Further, the first DF 31 outputs the inverted output signal XSG11 which is the reference signal RIN inverted, when the status of the reference signal RIN is changed. The NEX-OR gate 35 in the phase difference detector 29 detects a phase difference between the inverted output signal XSG11 and the reference signal RIN. The phase difference between the rising (falling) of the reference signal RIN (EFM signal SG4) and the rising of the clock CLK (feedback signal FIN) can be adequately detected by using the inverted output signal XSG11 which has been generated by the first DF 31 with the above-described simple circuit structure.

(5) The DF 37 in the phase difference computing circuit 30 determines if the rising of the clock CLK leads the rising (or falling) of the reference signal RIN based on the first phase difference detection signal SG21, and outputs the H-level output signal SG31 only when the rising of the clock CLK is later than the rising (or falling) of the reference signal RIN. When the rising of the clock CLK lags behind the rising (or falling) of the reference signal RIN, the JKF 38 sends the L-level inverted output signal XSG32 to the NAND gate 40 in order to suppress the output of the H-level second phase difference detection signal SG22 as the down-signal DN to the NAND gate 40. It is therefore possible to suppress the output of the L-level up-signal UP and down-signal DN in the locked state (case A) by using the DF 37 and the JKF 38, which have simple circuit structures. Furthermore, the output of the L-level down-signal DN can be suppressed even in case C (case C1 and case C2) in FIG. 17 (FIG. 18).

Second Embodiment

A phase comparator according to the second embodiment of this invention will be described below with reference to the accompanying drawings. To avoid a redundant description, like or same reference numerals are given to those components that are the same as the corresponding components of the first embodiment. The phase comparator according to the second embodiment is suitably incorporated in a data reading apparatus that reads data fast. In the fast data reading apparatus, with an optical disk rotated at a higher velocity in accordance with the CAV system, the pickup device reads data recorded on the optical disk in accordance with the CLV system. Therefore, the frequency of the EFM signal SG4 rises. So does the frequency of the reproduction clock CLK1 (feedback signal FIN). In the second embodiment, the feedback signal FIN has a frequency twice that of the feedback signal FIN in the first embodiment. With the feedback signal FIN in the first embodiment having a frequency of 10 MHZ, for example, the frequency of the feedback signal FIN in the second embodiment is 20 MHZ.

Figure 19:
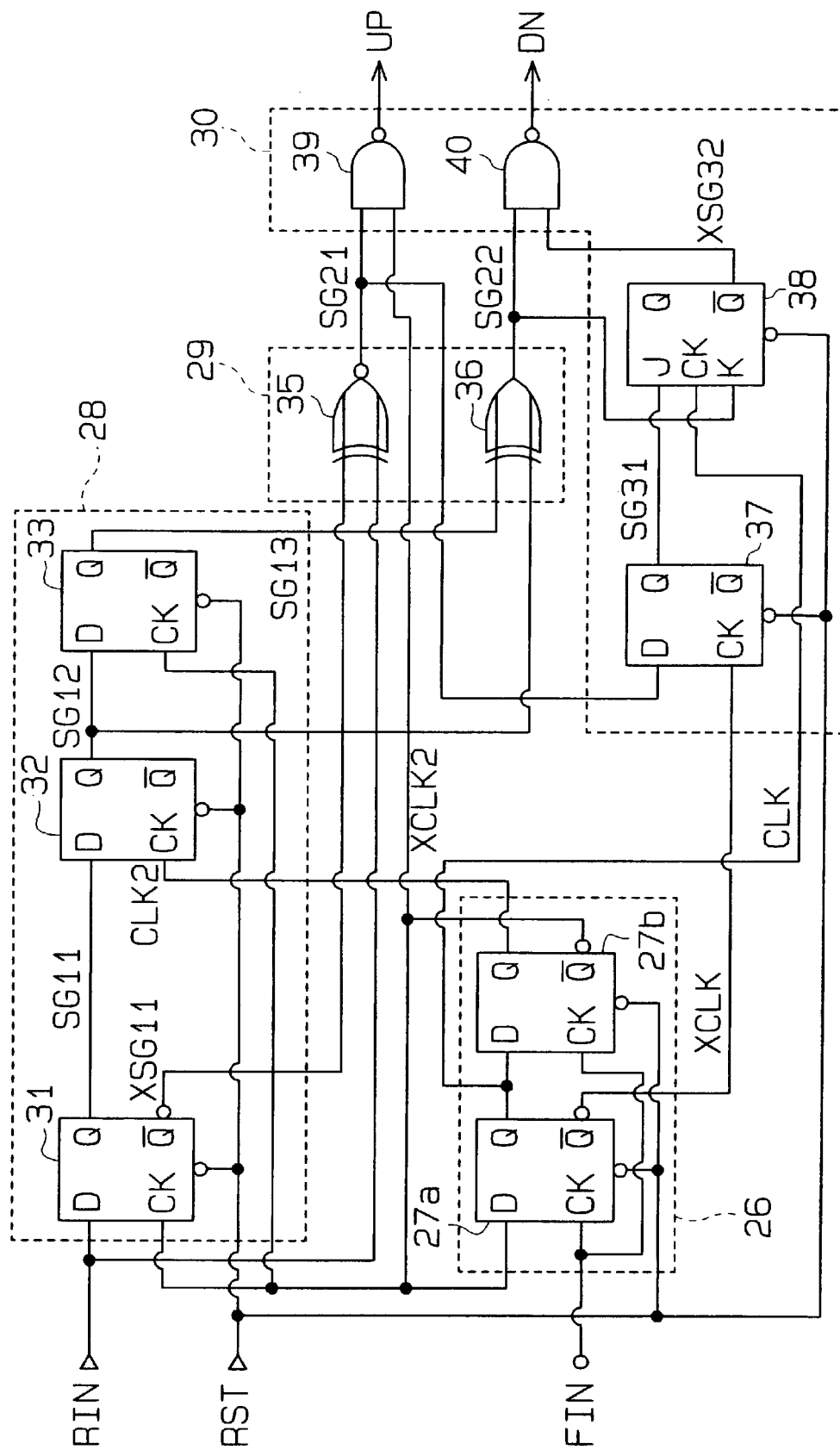
FIG. 19 is a block circuit diagram of a phase comparator according to a second embodiment of the invention.

FIG. 19 is a block diagram of the phase comparator according to the second embodiment. The frequency divider 26 in the second embodiment includes two D flip-flops (DFs) 27a and 27b.

The DF 27a at the first stage produces a first clock CLK which is the feedback signal FIN frequency-divided by 2 and a first inverted clock XCLK of the first clock CLK. The first clock CLK therefore has a period twice as long as that of the feedback signal FIN. The first clock CLK is supplied to the clock input terminal CK of the JKF 38 in the phase difference computing circuit 30. The first inverted clock XCLK is supplied to the clock input terminal CK of the DF 37 of the phase difference computing circuit 30.

The DF 27b at the second stage produces a second clock CLK2, which is the first clock CLK frequency-divided by 2 and a second inverted clock XCLK2 of the second clock CLK2. The second clock CLK2 therefore has a period four times the period of the feedback signal FIN. The second clock CLK2 is supplied to the clock input terminal CK of the second DF 32 in the synchronization circuit 28. The second inverted clock XCLK2 is supplied to the clock input terminals CK of the first and third DFs 31 and 33 of the synchronization circuit 28.

The functions of the phase comparator 22 according to the second embodiment will now be described case by case.

Case A1

Figure 20:
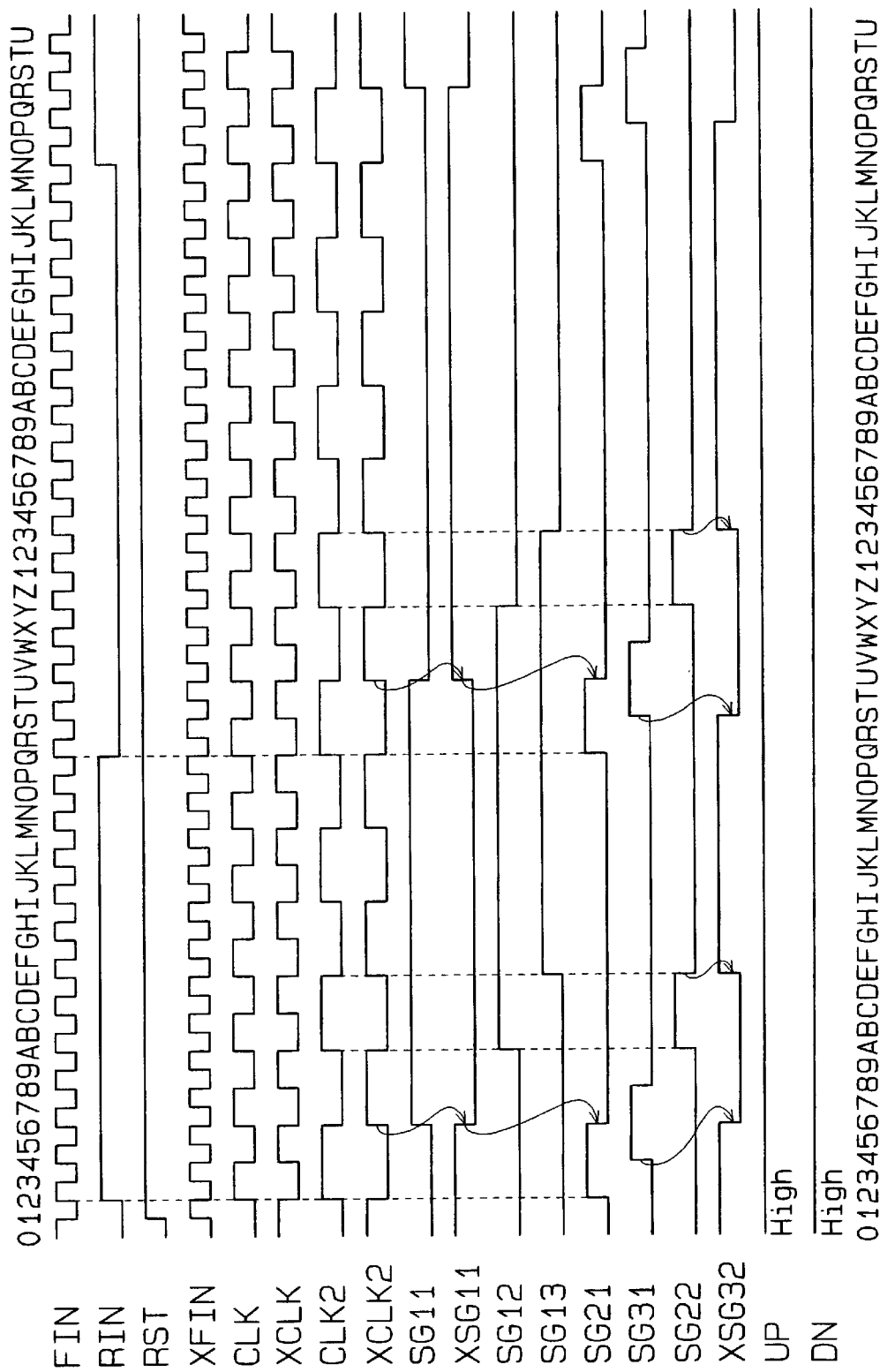
FIG. 20 is a timing chart illustrating the operation when the rising of the second clock coincides with the rising (falling) of the reference signal.

Case A1 where the rising of the second clock CLK2 coincides with the rising of the reference signal RIN will now be discussed with reference to FIG. 20. The first DF 31 causes the inverted output signal XSG11 to fall when the second inverted clock XCLK2 rises after half the period of the second clock CLK2 has passed since the rising of the reference signal RIN (the falling of the second inverted clock XCLK2).

The NEX-OR gate 35 causes the first phase difference detection signal SG21 to rise in response to the rising of the reference signal RIN and causes the first phase difference detection signal SG21 to fall in response to the falling of the inverted output signal XSG11. While the H-level first phase difference detection signal SG21 is output, the second inverted clock XCLK2 holds the L level. The NAND gate 39 therefore keeps outputting the H-level up-signal UP.

The DF 37 receives the H-level first phase difference detection signal SG21 and sends the H-level output signal SG31 to the JKF 38 when half the period of the clock CLK has passed. The JKF 38 receives the H-level output signal SG31 and sends out the L-level inverted output signal XSG32.

The EX-OR gate 36 outputs the H-level second phase difference detection signal SG22 for half the period of the second clock CLK2 in response to the rising of the next second clock CLK2 after the second clock CLK2 that rose at the same time as the reference signal RIN rose. However, the JKF 38 keeps outputting the L-level inverted output signal XSG32 for the output duration of the H-level second phase difference detection signal SG22. Thus, the NAND gate 40 keeps outputting the H-level down-signal DN.

Case A2

Case A2 where the rising of the second clock CLK2 coincides with the falling of the reference signal RIN will now be discussed with reference to FIG. 20.

The first DF 31 causes the inverted output signal XSG11 to rise when the second inverted clock XCLK2 rises after half the period of the second clock CLK2 has passed since the falling of the reference signal RIN (the falling of the second inverted clock XCLK2).

The NEX-OR gate 35 causes the first phase difference detection signal SG21 to rise in response to the falling of the reference signal RIN and causes the first phase difference detection signal SG21 to fall in response to the rising of the inverted output signal XSG11. While the H-level first phase difference detection signal SG21 is output, the second inverted clock XCLK2 holds the L level. The NAND gate 39 therefore keeps outputting the H-level up-signal UP.

The DF 37 receives the H-level first phase difference detection signal SG21 and sends the H-level output signal SG31 to the JKF 38 when half the period of the clock CLK has passed. The JKF 38 receives the H-level inverted output signal SG32 and sends out the L-level output signal SG31.

The EX-OR gate 36 outputs the H-level second phase difference detection signal SG22 for half the period of the second clock CLK2 in response to the rising of the next second clock CLK2 after the second clock CLK2 that rose at the same time as the reference signal RIN rose. However, the inverted output signal XSG32 holds the L level for the output duration of the H-level second phase difference detection signal SG22. Thus, the NAND gate 40 keeps outputting the H-level down-signal DN.

Case B1

Figure 21:
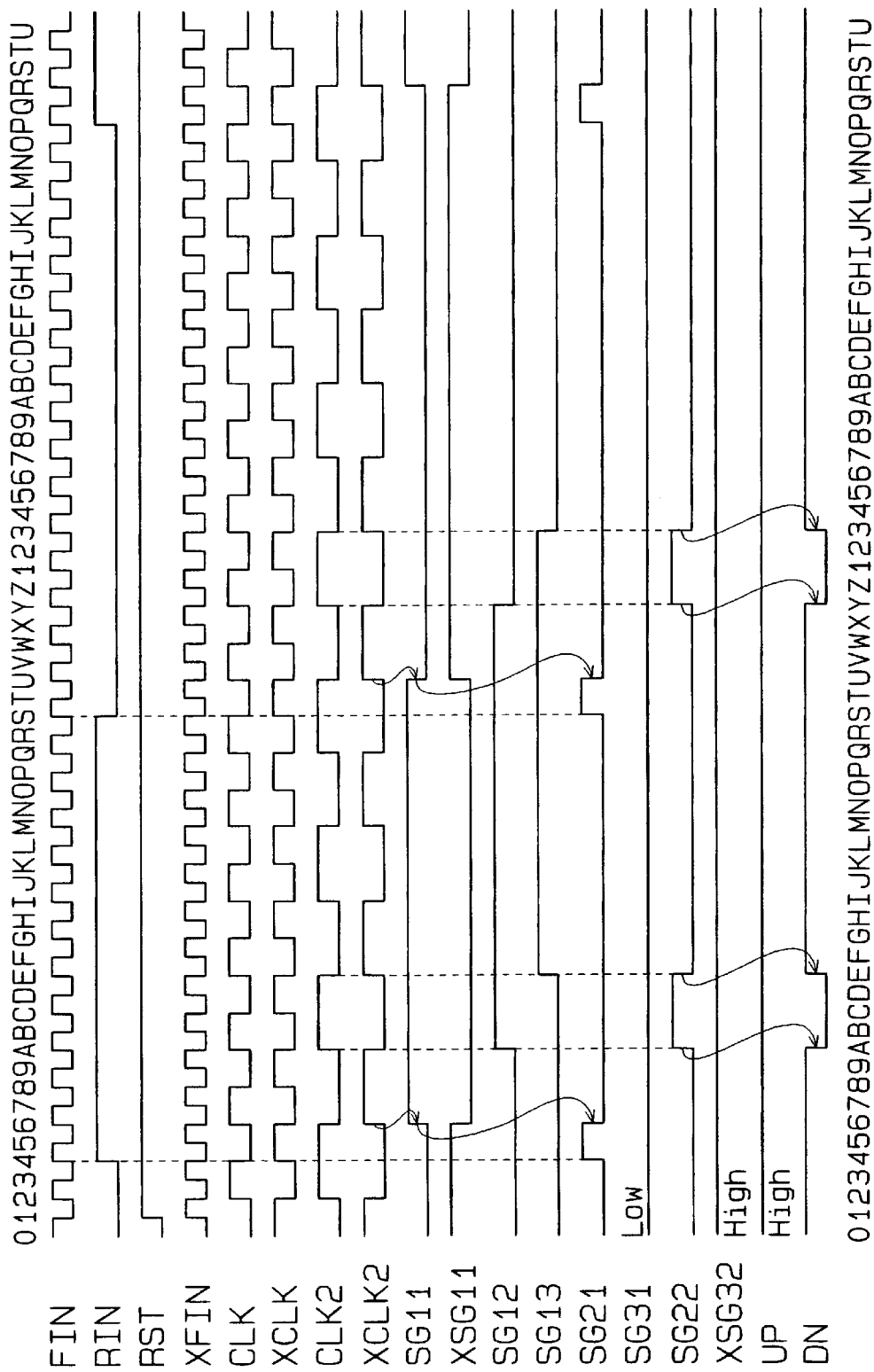
FIG. 21 is a timing chart illustrating the operation when the rising of the second clock leads the rising (falling) of the reference signal.

Case B1 where the rising of the second clock CLK2 leads the rising of the reference signal RIN by half the period of the clock CLK will be discussed below with reference to FIG. 21.

When the second inverted clock XCLK2 rises after half the period of the first clock CLK has passed since the rising of the reference signal RIN, the inverted output signal XSG11 falls.

The NEX-OR gate 35 causes the first phase difference detection signal SG21 to rise in response to the rising of the reference signal RIN and causes the first phase difference detection signal SG21 to rise in response to the falling of the inverted output signal XSG11. The first phase difference detection signal SG21 holds the H level for half the period of the clock CLK. During the output duration of the H-level first phase difference detection signal SG21, the second inverted clock XCLK2 holds the L level. The H-level up-signal UP is therefore maintained.

The DF 37 receives the H-level first phase difference detection signal SG21 and sends the L-level output signal SG31 to the JKF 38. The reason why the DF 37 outputs the L-level output signal SG31 is that the first phase difference detection signal SG21 holds the H level only for half the period of the first clock CLK. As a result, the JKF 38 receives the H-level second phase difference detection signal SG22 and the L-level output signal SG31, and sends the H-level inverted output signal XSG32 to the NAND gate 40.

The EX-OR gate 36 outputs the H-level second phase difference detection signal SG22 for half the period of the second clock CLK2 in response to the first rising of the second clock CLK2 after the rising of the reference signal RIN. The NAND gate 40 receives the H-level inverted output signal XSG32 and the H-level second phase difference detection signal SG22 and outputs the L-level down-signal DN for one period of the first clock CLK.

Case B2

Case B2 where the rising of the second clock CLK2 leads the falling of the reference signal RIN by half the period of the clock CLK will be discussed below with reference to FIG. 21.

When the second inverted clock XCLK2 rises after half the period of the first clock CLK has passed since the falling of the reference signal RIN, the inverted output signal XSG11 rises.

The NEX-OR gate 35 causes the first phase difference detection signal SG21 to rise in response to the falling of the reference signal RIN and causes the first phase difference detection signal SG21 to fall in response to the rising of the inverted output signal XSG11. The first phase difference detection signal SG21 holds the H level for half the period of the clock CLK. During the output duration of the H-level first phase difference detection signal SG21, the second inverted clock XCLK2 holds the L level. The H-level up-signal UP is therefore maintained.

The DF 37 receives the H-level first phase difference detection signal SG21 and sends the L-level output signal SG31 to the JKF 38. The JKF 38 receives the H-level second phase difference detection signal SG22 and the L-level output signal SG31 and sends the H-level inverted output signal XSG32 to the NAND gate 40.

The EX-OR gate 36 outputs the H-level second phase difference detection signal SG22 for half the period of the second clock CLK2 in response to the first rising of the second clock CLK2 after the falling of the reference signal RIN. The NAND gate 40 receives the H-level second phase difference detection signal SG22 and the H-level inverted output signal XSG32 and outputs the L-level down-signal DN for one period of the first clock CLK.

Case C1

Figure 22:
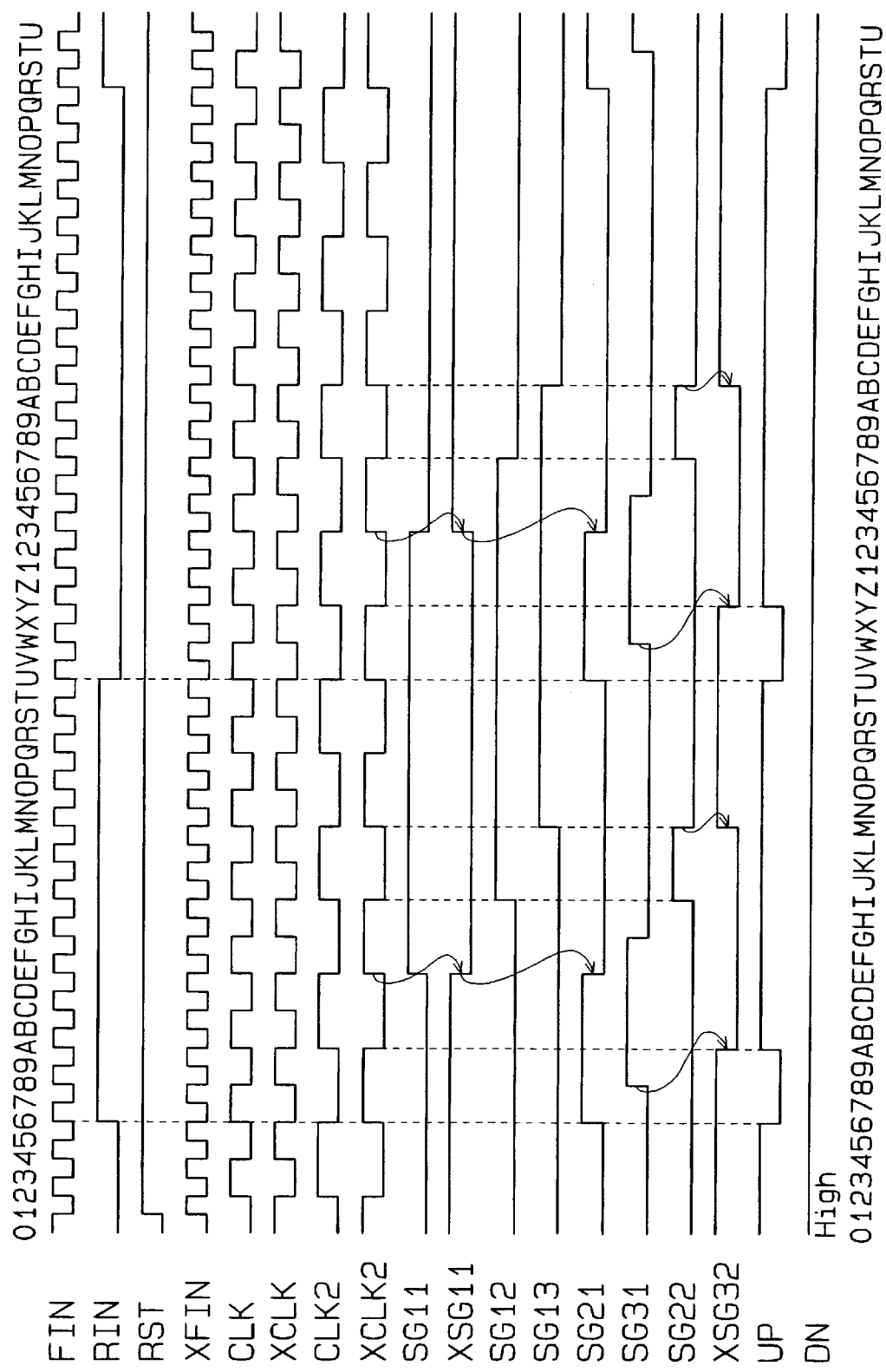
FIG. 22 is a timing chart illustrating the operation when the rising of the second clock lags behind the rising (falling) of the reference signal by one period of the first clock.

Case C1 where the rising of the second clock CLK2 lags behind the rising of the reference signal RIN by one period of the clock CLK will now be discussed with reference to FIG. 22.

The inverted output signal XSG11 falls when the second inverted clock XCLK2 rises after two periods of the first clock CLK have passed since the rising of the reference signal RIN.

The NEX-OR gate 35 causes the first phase difference detection signal SG21 to rise in response to the rising of the reference signal RIN and causes the first phase difference detection signal SG21 to fall in response to the falling of the inverted output signal XSG11. The first phase difference detection signal SG21 therefore holds the H level for two periods of the first clock CLK. For a period from the rising of the reference signal RIN to the passing of one period of the first clock CLK during the output duration of the H-level first phase difference detection signal SG21, the second inverted clock XCLK2 keeps the H level. The L-level up-signal UP is output for the output duration of the H-level second inverted clock XCLK2.

The DF 37 receives the H-level first phase difference detection signal SG21 and sends the H-level output signal SG31 to the JKF 38. The JKF 38 receives the H-level output signal SG31 and sends out the L-level inverted output signal XSG32.

The EX-OR gate 36 supplies the H-level second phase difference detection signal SG22 to the NAND gate 40 for half the period of the second clock CLK2 in response to the next rising of the second clock CLK2 after the rising of the reference signal RIN. However, the inverted output signal XSG32 holds the L level during the output duration of the H-level second phase difference detection signal SG22. Therefore, the H-level down-signal DN is maintained.

Figure 23:
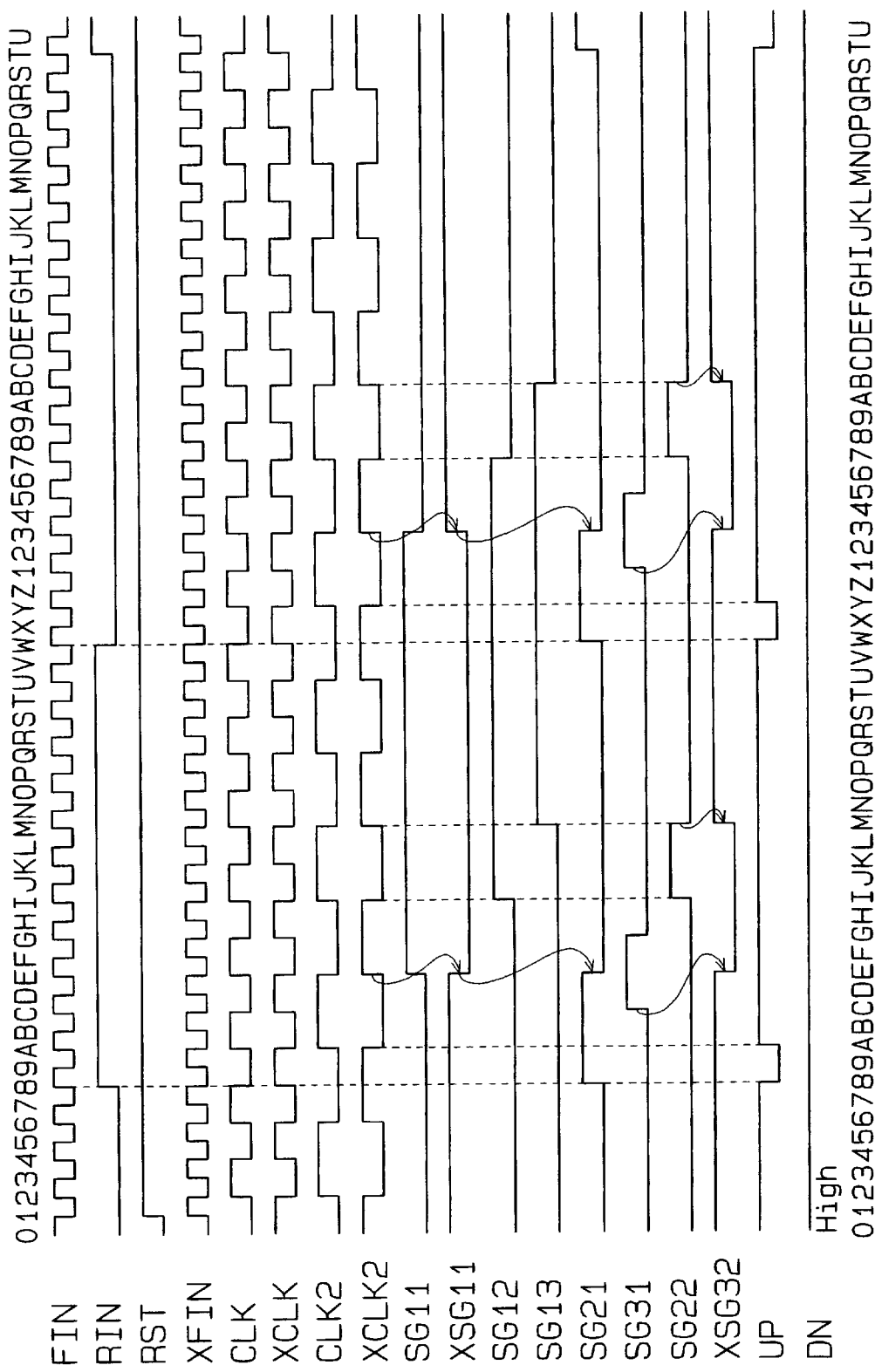
FIG. 23 is a timing chart illustrating the operation when the rising of the second clock lags behind the rising (falling) of the reference signal by half the period of the first clock.

When the rising of the second clock CLK2 lags behind the rising of the reference signal RIN by half the period of the first clock CLK, as shown in FIG. 23, the phase comparator 22 outputs the L-level up-signal UP for half the period of the first clock CLK.

Case C2

Case C2 where the rising of the second clock CLK2 lags behind the falling of the reference signal RIN by one period of the first clock CLK will be discussed below with reference to FIG. 22.

The inverted output signal XSG11 rises when the second inverted clock XCLK2 rises after two periods of the first clock CLK have passed since the falling of the reference signal RIN.

The NEX-OR gate 35 causes the first phase difference detection signal SG21 to rise in response to the falling of the reference signal RIN and causes the first phase difference detection signal SG21 to fall in response to the rising of the inverted output signal XSG11. The first phase difference detection signal SG21 therefore holds the H level for two periods of the first clock CLK. For a period from the falling of the reference signal RIN to the passing of one period of the first clock CLK during the output duration of the H-level first phase difference detection signal SG21, the second inverted clock XCLK2 keeps the H level. The L-level up-signal UP is output for the output duration of the H-level second inverted clock XCLK2.

The DF 37 receives the H-level first phase difference detection signal SG21 and sends the H-level output signal SG31 to the JKF 38. The JKF 38 receives the H-level output signal SG31 and sends out the L-level inverted output signal XSG32.

The EX-OR gate 36 supplies the H-level second phase difference detection signal SG22 to the NAND gate 40 for half the period of the second clock CLK2 in response to the next rising of the second clock CLK2 after the falling of the reference signal RIN. However, the JKF 38 keeps outputting the L-level inverted output signal XSG32 during the output duration of the H-level second phase difference detection signal SG22. Therefore, the H-level down-signal DN is maintained.

When the rising of the second clock CLK2 lags behind the falling of the reference signal RIN by half the period of the first clock CLK, as shown in FIG. 23, the phase comparator 22 outputs the L-level up-signal UP for half the period of the first clock CLK.

According to the second embodiment, as apparent from the above, the phase comparator 22 which is suitable for fast data reading is obtained by using the frequency divider 26, which includes two D flip-flops (DFs) 27a and 27b.

It should be apparent to those skilled in the art that the present invention may be embodied in many other specific forms without departing from the spirit or scope of the invention. Particularly, it should be understood that the invention may be embodied in the following forms.

The frequency-dividing ratio of the frequency divider 26 may be changed appropriately in accordance with the data reading speed. This invention may be adapted to a data reading apparatus that reads data from an optical disk, where the data has been recorded in accordance with a ZCLV (Zone Constant Linear Velocity) system, according to the CAV system.

Therefore, the present examples and embodiments are to be considered as illustrative and not restrictive and the invention is not to be limited to the details given herein, but may be modified within the scope and equivalence of the appended claims.

What is claimed is:

1. A phase comparator apparatus comprising:
   a detector circuit detecting a phase difference between first and second input signals to output a detection signal; and
   a compare output generator circuit, coupled to said detector circuit, determining a phase deviation between the first and second input signals using the detection signal and the second input signal, wherein said compare output generator circuit outputs a first compare output signal when the second input signal lags behind the first input signal and outputs a second compare output signal when the second input signal leads the first input signal.

2. The apparatus according to claim 1, wherein the first input signal has a variable frequency and the second input signal is a clock signal having a frequency that is higher than that of the first input signal.

3. The apparatus according to claim 2, further comprising a frequency divider, coupled to said detector circuit and said compare output generator circuit, receiving a third input signal having a frequency that is higher than that of the second input signal and frequency-dividing the third input signal to generate the second input signal.

4. The apparatus according to claim 3, wherein said compare output generator circuit judges whether the second input signal leads the first input signal using the detection signal and the third input signal.

5. The apparatus according to claim 3, wherein said frequency divider frequency-divides the third input signal to generate the second input signal having a frequency that is used in the comparison between the first and second input signals.

6. A phase comparator apparatus comprising:
   a synchronization signal generator circuit receiving first and second digital signals and generating a synchronization signal that is the first digital signal synchronizing with the second digital signal when a rising or falling edge of the first digital signal is detected;
   a phase difference detector circuit, coupled to said synchronization signal generator, receiving the first digital signal and the synchronization signal and detecting a phase difference between the first digital signal and the synchronization signal to output a detection signal;
   a first compare output generator circuit, coupled to said phase difference detector circuit, receiving the second digital signal and the detection signal and judging whether the second digital signal lags behind the first digital signal using the second digital signal and the detection signal to output a first compare output signal when the second input signal lags behind the first input signal; and a second compare output generator circuit, coupled to said phase difference detector circuit, receiving a third digital signal having a frequency higher than that of the second digital signal and the detection signal and judging whether the second digital signal leads the first digital signal using the third digital signal and the detection signal to output the second compare output signal when the second input signal leads the first input signal.

7. The apparatus according to claim 6, wherein the first digital signal has a variable frequency and the second digital signal is a clock signal having a frequency that is higher than that of the first digital signal.

8. The apparatus according to claim 7, further comprising a frequency divider, coupled to said synchronization signal generator circuit, said phase difference detector circuit and said first compare output generator circuit, receiving the third digital signal and frequency-dividing the third digital signal to generate the second digital signal.

9. The apparatus according to claim 7, wherein said frequency divider frequency-divides the third digital signal to generate the second digital signal having a frequency that is used in the comparison between the first and second digital signals.

10. A phase comparator apparatus comprising:
a synchronization signal generator circuit receiving first and second digital signals and generating a first synchronization signal that is the first digital signal synchronizing with the second digital signal when a rising or falling edge of the first digital signal is detected, wherein said synchronization signal generator generates a second synchronization signal lagging behind the first synchronization signal and generates a third synchronization signal lagging behind the second synchronization signal;
a phase difference detector circuit, coupled to said synchronization signal generator, receiving the first digital signal and the first synchronization signal and detecting a phase difference between the first digital signal and the first synchronization signal to output a first detection signal, wherein said phase difference detector further outputs a second detection signal indicative of a phase difference between the second and third synchronization signals; and
a compare output generator circuit, coupled to said phase difference detector circuit, receiving the second digital signal and a third digital signal having a frequency that is higher than that of the second digital signal and the first detection signal and determining a phase deviation between the first and second digital signals using the second and third digital signals and the first detection signal, wherein said compare output generator circuit outputs a first compare output signal when the second digital signal lags behind the first digital signal and outputs a second compare output signal when the second digital signal leads the first digital signal, wherein the second compare output signal corresponds to the second detection signal.

11. The apparatus according to claim 10, wherein the first digital signal has a variable frequency and the second digital signal is a clock signal having a frequency that is higher than that of the first digital signal.

12. The apparatus according to claim 11, further comprising a frequency divider, coupled to said synchronization signal generator circuit, said phase difference detector circuit and said compare output generator circuit, frequency-dividing the third digital signal to generate the second digital signal.

13. The apparatus according to claim 10, wherein said frequency divider frequency-divides the third digital signal to generate the second digital signal having a frequency that is used in the comparison between the first and second digital signals.

14. The apparatus according to claim 10, wherein said compare output generator circuit includes:
a first determination circuit, coupled to said synchronization signal generator, receiving the second digital signal and the first detection signal and determining whether the second digital signal lags behind the first digital signal using the second digital signal and the first detection signal to output the first compare output signal when the second digital signal lags behind the first digital signal; and
a second determination circuit, coupled to said synchronization signal generator, receiving the third digital signal and the first detection signal and determining whether the second digital signal leads the first digital signal using the third digital signal and the first detection signal to output the second compare output signal in response to the second detection signal when the second digital signal leads the first digital signal.

15. The apparatus according to claim 14, wherein said first determination circuit is a NAND gate.

16. The apparatus according to claim 14, wherein said second determination circuit includes:
a D flip-flop receiving the first detection signal in response to the third digital signal and determining whether the second digital signal leads the first digital signal to output a determination signal;
a JK flip-flop, coupled to the D flip-flop, receiving the second detection signal and the determination signal, wherein said JK flip-flop outputs an allowance signal allowing the output of the second compare output signal when the determination signal indicates the second digital signal does not lead the first digital signal and outputs a regulation signal regulating the output of the second compare output signal; and
a NAND gate, coupled to the JK flip-flop, receiving the second detection signal and the allowance or regulation signal and outputting the second compare output signal in response to the regulation signal.

17. A phase lock loop circuit comprising:
a phase comparator comparing a first input signal and a second input signal to output first or second compare output signals, the first compare output signal indicating that the second input signal lags behind the first input signal, the second compare output signal indicating that the second input signal leads the first input signal, said phase comparator including:
a detector circuit detecting a phase difference between the first and second signals to output a detection signal; and
a compare output generator circuit, coupled to said detector circuit, determining a phase deviation between the first and second input signals using the detection signal and the second input signal, wherein said compare output generator circuit outputs the first compare output signal when the second input signal lags behind the first input signal and outputs the second compare output signal when the second input signal leads the first input signal.

18. A data demodulator apparatus comprising:
a phase lock loop circuit including a phase comparator comparing a first input signal and a second input signal to output first or second compare output signals, the first compare output signal indicating that the second input signal lags behind the first input signal, the second compare output signal indicating that the second input signal leads the first input signal, said phase comparator apparatus including
a detector circuit detecting a phase difference between the first and second signals to output a detection signal; and
a compare output generator circuit, coupled to said detector circuit, determining a phase deviation between the first and second input signals using the detection signal and the second input signal, wherein said compare output generator circuit outputs the first compare output signal when the second input signal lags behind the first input signal and outputs the second compare output signal when the second input signal leads the first input signal.

19. A data reading apparatus comprising a data demodulator circuit including a phase lock loop circuit, said phase lock loop circuit including a phase comparator comparing a first input signal and a second input signal to output first or second compare output signals, the first compare output signal indicating that the second input signal lags behind the first input signal, the second compare output signal indicating that the second input signal leads the first input signal, said phase comparator apparatus including
a detector circuit detecting a phase difference between the first and second input signals to output a detection signal; and
a compare output generator circuit, coupled to said detector circuit, determining a phase deviation between the first and second input signals using the detection signal and the second input signal, wherein said compare output generator circuit outputs the first compare output signal when the second input signal lags behind the first input signal and outputs the second compare output signal when the second input signal leads the first input signal.

20. The apparatus according to claim 19, further comprising a pickup device reading data recorded on a recording medium and generating an analog read signal associated with the first input signal while rotating the recording medium at a constant speed.

21. A method for comparing a first input signal and a second input signal to generate first or second compare output signals, the first compare output signal indicating that the second input signal lags behind the first input signal, the second compare output signal indicating that the second input signal leads the first input signal, said method comprising:
detecting a phase difference between the first and second input signals to generate a detection signal;
determining a phase deviation between the first and second input signals using the detection signal and the second input signal; generating the first compare output signal when the second input signal lags behind the first input signal; and
generating the second compare output signal when the second input signal leads the first input signal.

22. The method according to claim 21, wherein the first input signal has a variable frequency and the second input signal is a clock signal having a frequency that is higher than that of the first input signal.

23. The method according to claim 21, further comprising:
receiving a third input signal having a frequency that is higher than that of the second input signal; and
frequency-dividing the third input signal to generate the second input signal.

24. The method according to claim 23, wherein said determining step includes judging whether the second input signal leads the first input signal using the detection signal and the third input signal.

25. The method according to claim 23, wherein said frequency-dividing step includes frequency-dividing the third input signal to generate the second input signal having a frequency that is used in the comparison between the first and second input signals.

26. A method for comparing a first digital signal and a second digital signal to generate first or second compare output signals, the first compare output signal indicating that the second input signal lags behind the first input signal, the second compare output signal indicating that the second input signal leads the first input signal, said second signal originating from a third digital signal having a frequency that is higher than that of the second digital signal, comprising:
detecting a rising or falling edge of the first digital signal;
generating a synchronization signal that is the first digital signal synchronizing with the second digital signal when the rising or falling edge of the first digital signal is detected;
detecting a phase difference between the first digital signal and the synchronization signal to generate a detection signal;
judging whether the second digital signal lags behind the first digital signal using the second digital signal and the detection signal;
generating the first compare output signal when the second input signal lags behind the first input signal;
judging whether the second digital signal leads the first digital signal using the third digital signal and the detection signal; and
generating the second compare output signal when the second input signal leads the first input signal.

27. The method according to claim 26, wherein the first digital signal has a variable frequency and the second digital signal is a clock signal having a frequency that is higher than that of the first digital signal.

28. The method according to claim 27, further comprising a step of frequency-dividing the third digital signal to generate the second digital signal.

29. The method according to claim 28, wherein said frequency-dividing step includes a step of frequency-dividing the third digital signal to generate the second digital signal having a frequency that is used in the comparison between the first and second digital signals.

30. A method for comparing a first digital signal and a second digital signal to generate first or second compare output signals, the first compare output signal indicating that the second input signal lags behind the first input signal, the second compare output signal indicating that the second input signal leads the first input signal, said second digital signal originating from a third digital signal having a frequency that is higher than that of the second digital signal, comprising:
detecting a rising or falling edge of the first digital signal;
generating a first synchronization signal that is the first digital signal synchronizing with the second digital signal when the rising or falling edge of the first digital signal is detected;

generating a second synchronization signal lagging behind the first synchronization signal;

generating a third synchronization signal lagging behind the second synchronization signal;

detecting a phase difference between the first digital signal and the first synchronization signal to generate a first detection signal;

generating a second detection signal indicative of a phase difference between the second and third synchronization signals;

determining a phase deviation between the first and second digital signals using the second and third digital signals and the first detection signal;

generating the first compare output signal when the second digital signal lags behind the first digital signal; and generating the second compare output signal when the second digital signal leads the first digital signal, wherein the second compare output signal corresponds to the second detection signal.

31. The method according to claim 30, wherein the first digital signal has a variable frequency and the second digital signal is a clock signal having a frequency that is higher than that of the first digital signal.

32. The method according to claim 30, further comprising a step of frequency-dividing the third digital signal to generate the second digital signal.

33. The method according to claim 30, wherein said frequency-dividing step includes frequency-dividing the third digital signal to generate the second digital signal having a frequency that is used in the comparison between the first and second digital signals.

34. The method according to claim 30, wherein said determining step includes:

first determining whether the second digital signal lags behind the first digital signal using the second digital signal and the first detection signal; and second determining whether the second digital signal leads the first digital signal using the third digital signal and the first detection signal.

35. The method according to claim 34, wherein said second determining step includes:

receiving the first detection signal in response to the third digital signal;

determining whether the second digital signal leads the first digital signal to generate a determination signal;

generating an allowance signal allowing the output of the second compare output signal when the determination signal indicates the second digital signal does not lead the first digital signal;

generating a regulation signal regulating the output of the second compare output signal; and outputting the second compare output signal in response to the regulation signal.

* * * * *